(12) United States Patent
Ebihara et al.

(10) Patent No.: US 8,767,172 B2
(45) Date of Patent: Jul. 1, 2014

(54) PROJECTION OPTICAL DEVICE AND EXPOSURE APPARATUS

(75) Inventors: Akimitsu Ebihara, Fukaya (JP); Martin E. Lee, San Jose, CA (US); Bausan Yuan, San Jose, CA (US)

(73) Assignee: Nikon Corporation, Tokyo (JP)

( * ) Notice: Subject to any disclaimer, the term of this patent is extended or adjusted under 35 U.S.C. 154(b) by 158 days.

(21) Appl. No.: 12/926,159

(22) Filed: Oct. 28, 2010

(65) Prior Publication Data

US 2011/0043781 A1     Feb. 24, 2011

Related U.S. Application Data

(63) Continuation of application No. 11/662,330, filed as application No. PCT/US2005/025454 on Jul. 18, 2005, now abandoned.

(60) Provisional application No. 60/614,426, filed on Sep. 30, 2004.

(51) Int. Cl.
    *G03B 27/42* (2006.01)
(52) U.S. Cl.
    USPC .............................................. 355/53
(58) Field of Classification Search
    CPC .......................... G03F 7/70833; G03F 7/709
    USPC ........................................ 355/53, 67, 72, 77
    See application file for complete search history.

(56) References Cited

U.S. PATENT DOCUMENTS

| | | | |
|---|---|---|---|
| 5,812,242 | A | 9/1998 | Tokuda |
| 6,255,796 | B1 | 7/2001 | Ebihara et al. |
| 6,791,664 | B2 * | 9/2004 | Auer et al. ............ 355/53 |
| 6,879,375 | B1 * | 4/2005 | Kayama ............ 355/53 |
| 6,940,582 | B1 | 9/2005 | Tanaka |
| 7,184,123 | B2 | 2/2007 | Duisters et al. |

(Continued)

FOREIGN PATENT DOCUMENTS

| | | |
|---|---|---|
| EP | 1 137 054 A1 | 9/2001 |
| EP | 1 403 713 A1 | 3/2004 |

(Continued)

OTHER PUBLICATIONS

Aug. 16, 2011 Office Action in Korean Patent Application No. 10-2007-7004795 (with English translation).

(Continued)

*Primary Examiner* — Peter B Kim
*Assistant Examiner* — Deoram Persaud
(74) *Attorney, Agent, or Firm* — Oliff PLC

(57) ABSTRACT

A projection optical device includes a projection optical system which projects an image of a pattern, a support member attached to the projection optical system, and a plurality of coupling members connected to the support member. The coupling members suspend and support the projection optical system through the support member from an upper direction of the support member. The projection optical device can include a frame to which one end of each of the coupling members is attached, such that the projection optical system hangs from the frame via the support member and the coupling members. A projection optical device also can include a liquid supply which supplies a temperature-controlled liquid to a side surface of a projection optical system utilizing gravity to cause the temperature-controlled liquid to flow along the side surface of the projection optical system.

39 Claims, 13 Drawing Sheets

(56) References Cited

U.S. PATENT DOCUMENTS

| | | | |
|---|---|---|---|
| 2002/0017890 A1 | 2/2002 | Ebihara et al. | |
| 2002/0027645 A1 | 3/2002 | Shiraishi | |
| 2003/0142281 A1 | 7/2003 | Nishi | |
| 2003/0197914 A1 | 10/2003 | Cox et al. | |
| 2003/0234918 A1 | 12/2003 | Watson | |
| 2004/0008331 A1* | 1/2004 | Cox et al. | 355/53 |
| 2004/0046947 A1 | 3/2004 | Yuan et al. | |
| 2004/0137384 A1 | 7/2004 | Hara | |
| 2004/0212794 A1 | 10/2004 | Mizuno | |
| 2005/0140955 A1* | 6/2005 | Butler et al. | 355/69 |
| 2005/0248739 A1 | 11/2005 | Box et al. | |
| 2007/0030462 A1* | 2/2007 | Yuan et al. | 355/18 |
| 2007/0139635 A1* | 6/2007 | Binnard et al. | 355/68 |
| 2008/0068568 A1* | 3/2008 | Ebihara et al. | 355/30 |
| 2009/0033895 A1* | 2/2009 | Binnard et al. | 355/53 |
| 2009/0086178 A1* | 4/2009 | Shibazaki | 355/53 |
| 2009/0147228 A1* | 6/2009 | Ono et al. | 355/53 |
| 2009/0190117 A1* | 7/2009 | Ono et al. | 355/67 |
| 2011/0032495 A1* | 2/2011 | Shibazaki | 355/30 |
| 2011/0032496 A1* | 2/2011 | Shibazaki | 355/30 |

FOREIGN PATENT DOCUMENTS

| | | |
|---|---|---|
| JP | A-1-253603 | 10/1989 |
| JP | A-09-102454 | 4/1997 |
| JP | A-11-135429 | 5/1999 |
| JP | A-11-251217 | 9/1999 |
| JP | A-2003-203860 | 7/2003 |
| JP | A-2004-221251 | 8/2004 |
| JP | A-2004-311626 | 11/2004 |
| JP | A-2004-340372 | 12/2004 |
| JP | A-2006-140366 | 6/2006 |
| JP | A-2007-005669 | 1/2007 |
| WO | WO 99/49504 | 9/1999 |
| WO | WO 01/22480 A1 | 3/2001 |

OTHER PUBLICATIONS

Aug. 13, 2008 extended European Search Report in European Patent Application No. 05 773 686.0.

Jun. 20, 2011 Office Action in European Patent Application No. 05 773 686.0.

Apr. 13, 2006 International Search Report issued in International Patent Application No. PCT/US2005/025454.

Aug. 17, 2010 Notice of Reasons for Rejection issued in Japanese Application No. 2007-534572 with English translation.

Jan. 24, 2013 Office Action issued in Taiwanese Patent Application No. 10220092880 (with translation).

\* cited by examiner

PROJECTION OPTICAL DEVICE AND EXPOSURE APPARATUS

This is a Continuation of application Ser. No. 11/662,330, filed Mar. 8, 2007, which is a National Stage Application of PCT/US2005/025454, filed Jul. 18, 2005, which claims of benefit of U.S. Provisional Application No. 60/614,426, filed Sep. 30, 2004. The disclosures of the prior applications are hereby incorporated by reference herein in their entirety.

BACKGROUND OF THE INVENTION

1. Field of Invention

This invention relates to a projection optical device provided with a projection optical system which projects an image of a predetermined pattern, and to an exposure apparatus which is used in order to transfer a pattern of a mask onto a substrate in order to manufacture various devices such as, for example, a semiconductor device, a liquid crystal display, etc.

2. Description of Related Art

In a lithography process, which is one process used to manufacture a semiconductor device, an exposure apparatus is used in order to transfer and expose a pattern formed on a reticle (or a photomask, etc.) onto a wafer (or a glass plate, etc.) coated by photoresist as a substrate. Various types of exposure apparatus, such as, for example, a step and repeat exposure type (stationary exposure type) projection exposure apparatus such as a stepper, and a step and scan exposure type projection exposure apparatus (scanning exposure apparatus) such as a scanning stepper, can be used.

In exposure apparatus, rigidity of: (i) the stages which move and position a reticle and a wafer, (ii) a support mechanism of the stages, and (iii) a mechanism portion of the support mechanism and the like of a projection optical system, significantly affects the performance capability of the apparatus, such as a vibration control performance capability, an exposure accuracy (overlay accuracy or the like), weight of the mechanism portion, and manufacturing cost of the exposure apparatus. In general, an exposure apparatus having a mechanism portion with high rigidity, while providing a high apparatus performance capability, tends to have a heavy mechanism portion, and a higher manufacturing cost. Furthermore, rigidity of the mechanism portion also is related to the temperature characteristics of the apparatus performance capability, and the stability of the apparatus performance capability corresponding to changes of the apparatus performance capability over time. That is, exposure apparatus having a mechanism portion with high rigidity tend to have good stability with respect to the apparatus performance capability, and excellent temperature characteristics, but depending on the structure of the mechanism portion, there are cases in which the opposite trend occurs. For example, in a mechanism portion, when members with high rigidity are coupled to each other through members having high rigidity, vibration can be easily transmitted, a bi-metal effect is generated at the time of temperature change (if different materials are used for the members), and the temperature characteristics may be deteriorated.

However, as a result of increasing rigidity of the mechanism portion, when the weight of the mechanism portion increases, there also is a possibility of increased construction cost of the device manufacturing factory in which exposure apparatus is installed (in order to deal with the weight of the exposure apparatus). Therefore, conventionally, in order to maintain high rigidity and perform positioning and scanning at a high speed while reducing the apparatus weight, a lightweight material with specific stiffness (value in which rigidity is divided by the weight per unit volume), such as a ceramic, can be used as a material of a part of the members which constitute a stage.

Furthermore, an exposure apparatus also has been proposed in which the stages and the projection optical system are independently supported by parallel link mechanisms, each having a plurality of rods which can expand and contract. This system maintains high rigidity in a necessary portion and lightens the weight of the entire mechanism portion. See, e.g., International Publication No. WO 01/022480.

Thus, in a conventional exposure apparatus, in order to maintain a high device capability with respect to vibration control performance or the like, it is desirable to improve rigidity of a mechanism portion of a support mechanism or the like, while reducing the weight of the mechanism portion. However, among conventional technology, with respect to a method of using a material with specific stiffness and light weight, the material can be used only for a portion of the mechanism portion due to its high manufacturing cost, the material shape, or the like, so the lightening of the entire mechanism portion is not yet significantly improved. In order to further lighten the entire mechanism portion, it is desirable to change the structure itself of the mechanism portion including the support mechanism of the projection optical system.

Meanwhile, in the method that uses parallel link mechanisms, each having a plurality of elongatable rods, it is desirable to further improve the lightening of the mechanism portion, and the control accuracy of a movable portion of a stage. However, there is a possibility that control at the time of scanning and stage positioning also becomes complex because the structure of the mechanism portion becomes complex. Additionally, although the projection optical system can be supported by using the parallel link mechanism, this tends to cause the structure of the mechanism portion to become even more complex. In this regard, in recent exposure apparatus, a thermal distortion amount of the mechanism portion and a fluctuation amount of imaging characteristics of the projection optical system due to the exposure amount of the exposure beam and the surrounding temperature are predicted in advance. According to this prediction result, correction of the imaging characteristics, positioning correction of the reticle and the wafer, or the like is performed during use of the apparatus. However, once the mechanism portion becomes complex, the estimated accuracy of the thermal distortion amount of the mechanism portion and the fluctuation amount of the imaging characteristic deteriorates, and therefore it is possible that the exposure accuracy may deteriorate.

Furthermore, conventionally, in order to control the fluctuation amount of the imaging characteristic of the projection optical system due to the temperature fluctuation, a cooling liquid is supplied to the surrounding of the projection optical system. In this case, in order to increase the vibration control performance capability of the exposure apparatus, it is desirable that the vibration of the motive force which supplies the cooling liquid should be controlled.

SUMMARY OF THE INVENTION

This invention reflects on the above problems, and has as a first object, the provision of a support for a projection optical system using a relatively simplified, light mechanism in a state in which a high vibration isolation performance capability is obtained.

A second object of this invention is to provide an exposure apparatus which can maintain a high device performance capability, such as a positioning performance capability, and obtain high rigidity where necessary, and lighten the entire mechanism portion.

A third object of this invention is to reduce vibration when a cooling liquid is supplied to the surrounding of the projection optical system.

In a projection optical device according to a first aspect of this invention, a projection optical system that projects an image of a pattern is supported by a support member and a plurality of coupling members which suspend and support the projection optical system via the support member from the upper direction of the support member.

According to this aspect of the invention, the projection optical system is supported so as to be suspended in a vertical direction via the coupling member from a predetermined member (e.g., frame or the like). Therefore, in a relatively simplified and light mechanism, the vibration of the predetermined member is not easily transmitted to the projection optical system, and the characteristic frequency of the coupling member is low. Thus, a high vibration control performance capability can be obtained.

In this case, the predetermined member and the projection optical system can be considered as a rigid structure with high rigidity, and the coupling member can be considered as a flexible structure with low rigidity. According to this aspect of the invention, a ratio occupied by members having a rigid structure decreases within the device, and a flexible structure is used. In general, a flexible structure has a characteristic opposite to that of a rigid structure, is light, has a low cost, and can obtain a preferable characteristic of shielding vibration and receiving/transmitting thermal displacement depending on the structure of the flexible structure. According to this aspect of the invention, a rigid structure can be used for the portion(s) which directly affect(s) device performance capability, and a flexible structure can be used for the portion(s) that couple rigid structures to each other. By this structure, the effects of thermal displacement and the transmittance of the vibration are minimized or prevented entirely. Therefore, the mechanism portion can be lightened while the device performance capability is kept high.

According to this aspect of the invention, in one example, there are three coupling members, each of which has a lower characteristic frequency in a direction perpendicular to the optical axis than in the direction parallel to the optical axis of the projection optical system. By having three coupling members, the projection optical system is supported in a stable manner. Furthermore, because the coupling members are comprised of, for example, thin long members extending in a direction along the optical axis, the characteristic frequency of the coupling members becomes low in a direction perpendicular to the optical axis. Thus, with respect to the vibration having a high frequency component, blurring (deterioration of the contrast) of the image position is reduced when the image pattern is transferred via the projection optical system.

In one example, the coupling members include wires or rod members provided with flexures on their top end portion and/or their lower end portion. The length of the coupling members preferably is 1 m or greater. Thus, when the length of the coupling member is 1 m or greater, the characteristic frequency in the direction perpendicular to the optical axis of the coupling member is substantially 0.5 Hz or less, so the projection optical system is extremely stably supported with respect to external vibration.

Furthermore, in part of the coupling member, vibration isolation portions can be arranged which reduce the vibration in the optical axis direction of the projection optical system. By so doing, the vibration in the direction parallel to the optical axis of the projection optical system can be further reduced.

Furthermore, a frame which supports the coupling members, and a positioning device which positions the projection optical system without contacting the frame can be provided.

According to this aspect of the invention, the coupling members have a flexible structure, so the frame with a rigid structure and the projection optical system can be relatively displaced at a low frequency. In such a case, by using the positioning device, the relative position of the frame and the projection optical system (i.e., the support member of the projection optical system) is held at a target position, so a preferable characteristic (the lightening of the mechanism portion and shielding of vibration and effects of temperature changes) due to having a flexible structure can be maintained, and the device performance capability, such as stability of the position of the projection image or the like can be improved. In other words, with respect to vibration within the frequency range which can be controlled by the positioning device, the projection optical system is supported by an active suspension control method, and with respect to the vibration at frequencies which exceed this frequency range, the projection optical system is suspended and supported by a passive vibration isolation structure.

The positioning device also can be provided with displacement sensors which measure six degrees-of-freedom of displacement information of the projection optical system with respect to the frame, and six degrees-of-freedom actuators which position the projection optical system in a non-contact manner with respect to the frame. By using the measurement result of the displacement sensors, the relative position of the projection optical system with respect to the frame can be controlled.

Furthermore, in one example, the support member is a flange portion fixed to the side surface of the projection optical system, and the flange portion kinematically supports a measurement unit having a sensor which measures the positional relationship between the projection optical system and a predetermined member (e.g., the wafer stage). Therefore, the measurement unit is supported in a state in which there is a predetermined positional relationship with respect to the projection optical system, and very little stress is applied, so the positional relationship between the projection optical system and the predetermined member can be measured with high accuracy.

In one example, a member (reticle) in which the pattern is formed can be integrally provided with the projection optical system. This is effective, for example, when the pattern is transferred by a step and repeat exposure method. In this case, a micro-moving mechanism can be provided which micro-moves the reticle with respect to the projection optical system. Positioning of the reticle pattern can be performed by the micro-moving mechanism.

In another example, a frame which supports the coupling members, a base which is supported to the frame via vibration isolation members, and a stage which drives the member in which the pattern is formed on the base can be provided. For example, when the pattern is transferred by a scanning exposure method, the member in which the pattern is formed can be scanned with the stage. Furthermore, the vibration isolation member is operated as a flexible structure which couples the base and the frame as a rigid structure, and application of an extra stress to the base can be suppressed by the vibration isolation member.

In this case, as an example, the vibration isolation member can include pivots or flexures. Pivots or flexures allow a rotational motion, so they can be vibration isolation members as a simplified mechanism.

Furthermore, in order to cancel a reaction force caused by the movement of the stage, a countermass member which is moved on the base, and a flexure mechanism which supports the countermass member on the base can be further provided. By so doing, transmission of vibrations between the countermass member and the base can be even more completely shielded.

According to another aspect of this invention, the projection optical system can be arranged in a downflow environment. The projection optical system is suspended and supported, so a gas such as temperature-controlled air smoothly flows in the vicinity of the projection optical system by a downflow method. Therefore, temperature stability of the projection optical system is improved.

Additionally, according to this aspect of the invention, the measurement unit is provided with laser interferometers, and also can be provided with a local gas flow system which performs a local downflow with respect to the optical path of the laser beam of the laser interferometers. By so doing, the measurement accuracy of the laser interferometers is improved.

In addition, a pipe which is arranged along the side surface of the projection optical system from the coupling members, and a liquid supply system which supplies a cooling liquid to the pipe, can be provided. In this structure, the coupling members also can be used as support members of the pipe, and the temperature stability of the projection optical system is improved.

In a projection optical device according to a second aspect of this invention, a projection optical system which projects an image of a pattern is provided with a liquid supply device which supplies a cooling liquid to the side surface of the projection optical system by a gravity drive. According to this aspect of the invention, the cooling liquid flows due to gravity, so hardly any vibration is generated.

According to this aspect of the invention, in one example, the liquid supply device is provided with a pipe which is wrapped around the side surface of the projection optical system, and a liquid circulation system which circulates the cooling liquid to the pipe according to a siphon principle. With this structure, the cooling liquid can be circulated by a simplified structure.

An exposure apparatus can be provided with a projection optical device according to various aspects of this invention. Such an exposure apparatus transfers and exposes an image of the pattern onto a substrate by the projection optical system. In this exposure apparatus, when the projection optical device according to the first aspect of this invention is provided, in a portion in which the projection optical system or the like is needed, high rigidity can be obtained, and the device performance capability of the vibration isolation performance capability or the like can be kept high, and the entire mechanism portion can be lightened by suspending and supporting the projection optical system.

Furthermore, by suspending and supporting the projection optical system as a rigid structure, via coupling members as a flexible structure, with respect to a predetermined member having a rigid structure, the respective advantages of the rigid and flexible structures can be utilized and combined. Therefore, compared to a conventional example, the ratio occupied by the rigid structure in the device can be reduced, so without decreasing the device performance capability, such as stability of the position of a projection image or the like, the mechanism portion can be lightened and manufactured at a lower cost.

In an exposure apparatus utilizing a projection optical device according to the second aspect of this invention, when a cooling liquid is supplied to the surrounding of the projection optical system, the vibration can be reduced.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

First Embodiment

The following explains a first exemplary embodiment of this invention with reference to FIGS. 1-6. In this embodiment, the invention is applied to a step and repeat exposure type projection exposure apparatus such as a stepper or the like, and to a step and scan exposure type projection exposure apparatus such as a scanning stepper or the like.

Figure 1:
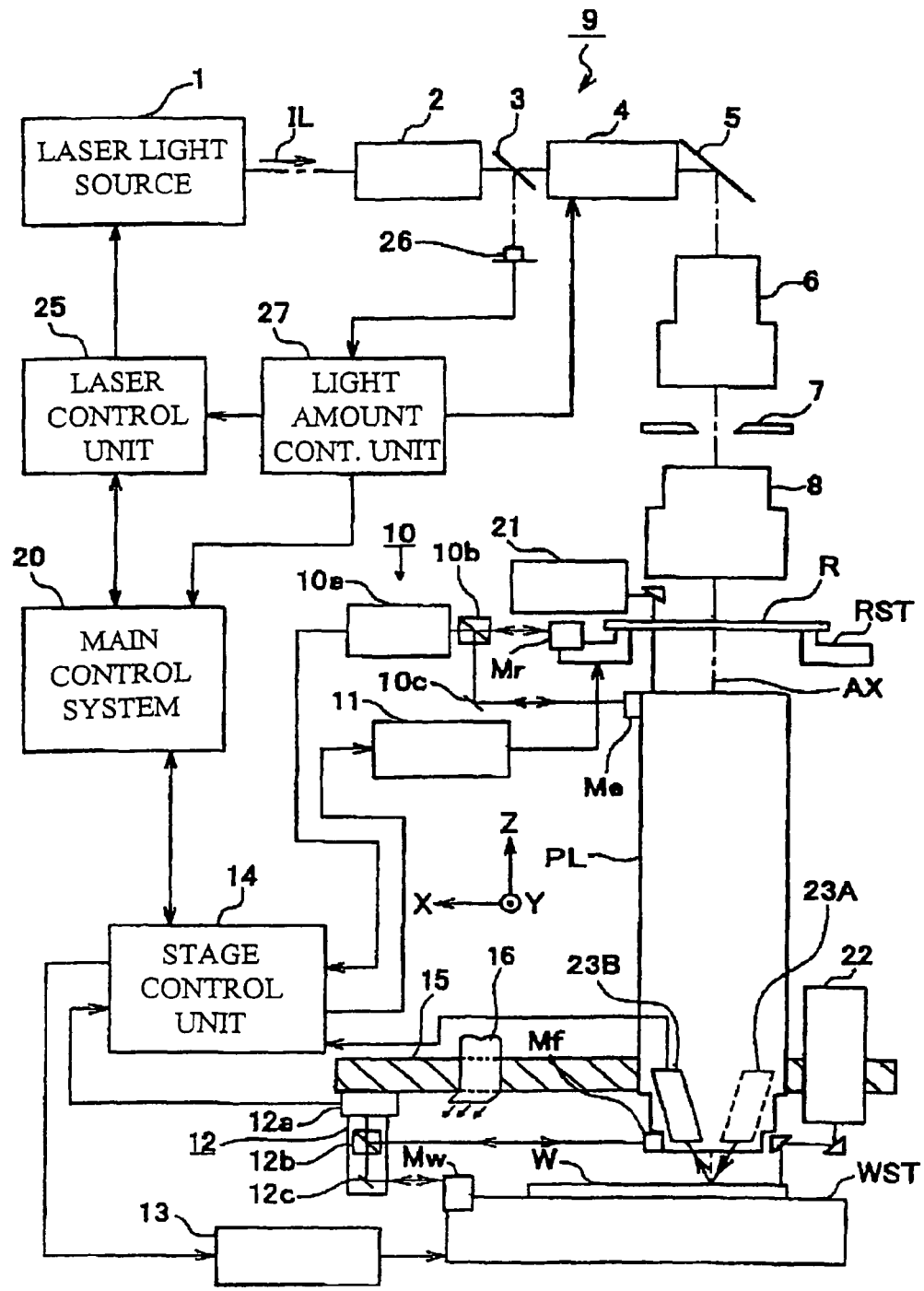
FIG. 1 is a diagram showing a schematic structure of a projection exposure apparatus of an embodiment of this invention.

FIG. 1 is a block diagram of different functional units which constitute a projection exposure apparatus of this embodiment. In FIG. 1, a chamber in which the projection exposure apparatus is located, is omitted. In FIG. 1, a laser light source 1 is provided. The laser light source 1 can be a KrF excimer laser (wavelength 248 nm) or an ArF excimer laser (wavelength 193 nm), for example. The light source also could be a device which radiates an oscillating laser beam in an ultraviolet range such as an $F_2$ laser (wavelength 157 nm), a device which radiates a harmonic laser beam in a vacuum ultraviolet range which can be obtained by wavelength-converting a laser beam in a near infrared range supplied from a solid-state laser light source (YAG or a semiconductor laser, or the like). A mercury discharge lamp, or the like, which is often used in this type of exposure apparatus also can be used.

Illumination light for exposure (exposure light) IL as an exposure beam from the laser light source 1 irradiates a reticle blind mechanism 7 with a uniform irradiation distribution via a homogenizing optical system 2, which is constituted by a lens system and a fly's eye lens system, a beam splitter 3, a variable attenuator 4 for adjusting a light amount, a mirror 5, and a relay lens system 6. The illumination light IL which is restricted to a predetermined shape (e.g., a square shape in a step and repeat exposure type, and a slit shape in a step and scan exposure type) by the reticle blind mechanism 7 is irradiated onto a reticle R (a mask) via an imaging lens system 8, and an image of an opening of the reticle blind 7 is imaged on the reticle R. An illumination optical system 9 is constituted by the above-described homogenizing optical system 2, the beam splitter 3, the variable attenuator 4, the mirror 5, the relay lens system 6, the reticle blind mechanism 7, and the imaging lens system 8.

In a circuit pattern region formed on the reticle R, the image of the portion irradiated by the illumination light is imaged and projected onto a wafer W coated by photoresist (a substrate) (a photosensitive substrate or a photosensitive body) via a projection optical system PL having a reduction projection magnification B and being both-side telecentric. For example, the projection magnification B of the projection optical system PL can be ¼, ⅕, or the like, the imaging side numeral aperture NA can be 0.7, and a diameter of a field of view can be approximately 27-30 mm. The projection optical system PL is a refractive system, but a cata-dioptric system or the like also can be used. The reticle R and the wafer W also can be considered as first and second objects, respectively. In the following explanation, a Z axis is defined to be parallel to an optical axis AX of the projection optical system PL, an X axis extends in a direction parallel to a paper plane of FIG. 1, and is perpendicular to the Z axis, and a Y axis extends in a direction perpendicular to a paper plane of FIG. 1. When a projection exposure apparatus of this example is a step and scan exposure type, a direction (Y direction) along the Y axis is a scanning direction of the reticle R and the wafer W during scanning exposure, and the illumination region on the reticle R becomes an elongated shape extending in a direction (X direction) along the X axis, which is a non-scanning direction.

Furthermore, the reticle R which is arranged on an object surface side of the projection optical system PL is held by vacuum pressure to a reticle stage RST (mask stage). In the case of a step and repeat exposure type, the reticle stage RST (micro-moving mechanism) is micro-moved on a reticle base (undepicted) in a rotation direction about the X and Y directions and in the Z axis direction, in addition to in the X and Y directions, so as to position the reticle R. Meanwhile, in the case of the scanning exposure apparatus, the reticle stage RST (stage) is moved at a constant speed at least in the Y direction (scanning direction) via an air bearing on a reticle base (undepicted). The moving coordinate position (the positions in the X and Y directions, and the rotation angle about the Z axis) of the reticle stage RST is successively measured by a moving mirror Mr fixed to the reticle stage RST, a reference mirror Me fixed to the upper portion side surface of the projection optical system PL, and a laser interferometer system 10 arranged opposite to these mirrors. The laser interferometer system 10 includes a laser interferometer main body portion 10a, a beam splitter 10b which divides the laser beam into a beam for the moving mirror Mr and a beam for the reference mirror Me, and a mirror 10c which supplies the laser beam to the reference mirror Me. Furthermore, the moving mirror Mr, the reference mirror Me, and the laser interferometer system 10 actually constitute at least a uniaxial laser interferometer system in the X direction, and a biaxial or a triaxial laser interferometer system in the Y direction.

Furthermore, the movement of the reticle stage RST is performed by a driving system 11 comprised of a linear motor, a micro-moving actuator, or the like. The measurement information of the laser interferometer system 10 is supplied to a stage control unit 14, and the stage control unit 14 controls the driving system 11 based on the control information (input information) received from a main control system 20 comprised of a computer which controls the operation of the entire device, and the measurement information.

Meanwhile, the wafer W arranged on the image plane side of the projection optical system PL is adsorbed and held on the wafer stage WST (substrate stage) via an undepicted wafer holder. In the case of the step and repeat exposure type, the wafer stage WST is step-moved in the X and Y directions via an air bearing on a wafer base (undepicted). In the case of the scanning exposure type, the wafer stage WST can be moved at a constant speed at least in the Y direction at the time of scanning exposure, and is mounted on a wafer base (undepicted) via an air bearing so as to be step-moved in the X and Y directions. The moving coordinate position (the positions in the X and Y directions, the rotation angle about the Z axis) of the wafer stage WST is successively measured by a reference mirror Mf fixed to the lower portion of the projection optical system PL, a moving mirror Mw fixed to the wafer stage WST, and a laser interferometer system 12 arranged opposite to these mirrors. The laser interferometer system 12 includes a laser interferometer main body portion 12a, a beam splitter 12b which divides a laser beam into a beam for the moving mirror Mw and a beam for the reference mirror Mf, and a mirror 12c which supplies a laser beam to the moving mirror Mw. The moving mirror Mw, the reference mirror Mf, and the laser interferometer system 12 actually constitute at least a uniaxial laser interferometer system in the X direction, and a biaxial or a triaxial laser interferometer system in the Y direction. Furthermore, the laser interferometer system 12 is further provided with a biaxial laser interferometer for rotation angle measurement about the X and Y axes.

Figure 2:
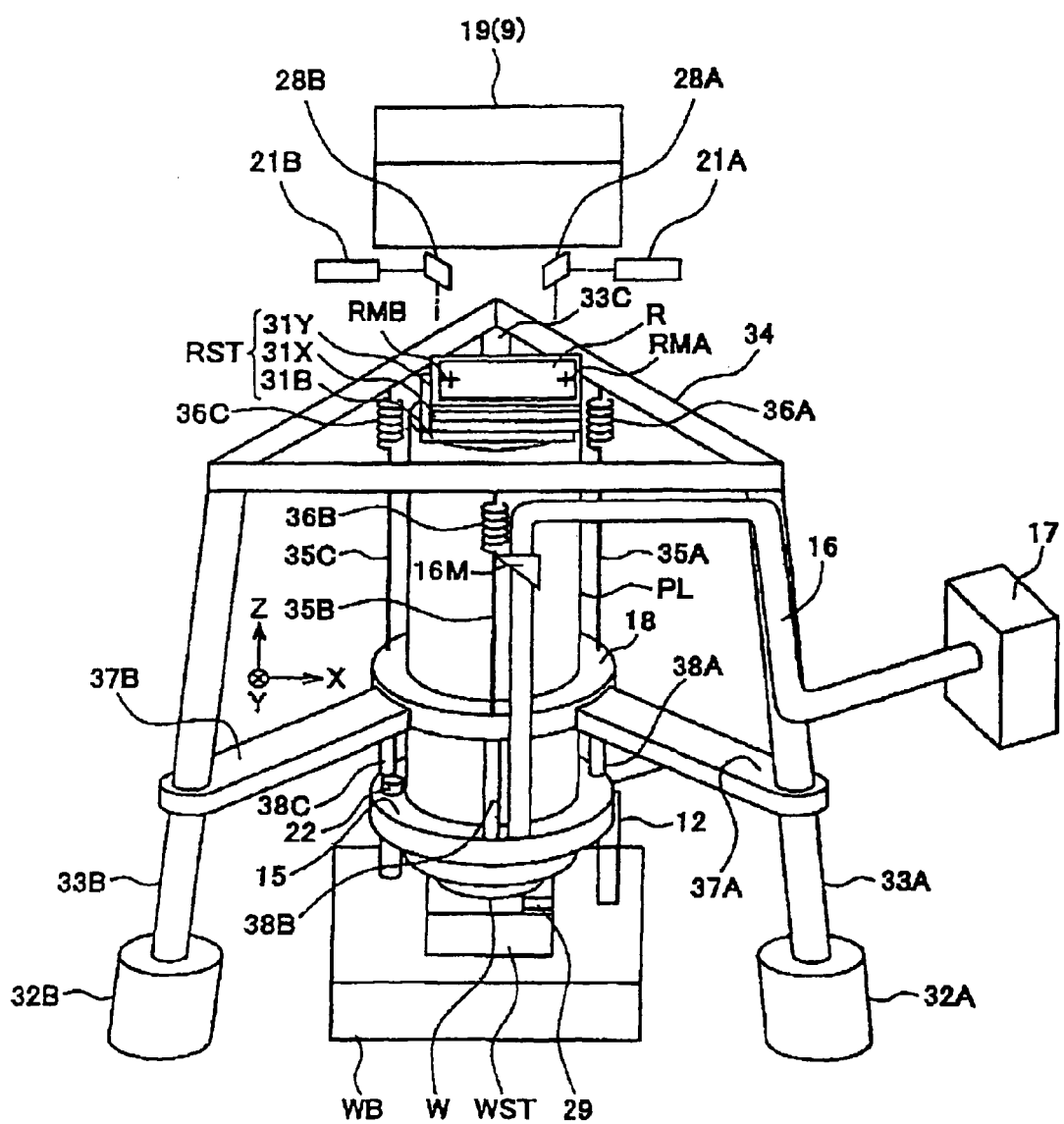
FIG. 2 is a perspective view showing a schematic structure of a mechanism portion of a projection exposure device of a first exemplary embodiment of this invention.

The laser interferometer system 12 (laser interferometer) can be considered as one sensor for measuring a positional relationship between the projection optical system PL and the wafer stage WST as a predetermined member. The laser interferometer system 12 is fixed to the bottom surface of a measurement mount 15 (measuring unit) which is an annular flat plate-shaped member arranged on the lower portion side surface of the projection optical system PL. Furthermore, in order to reduce fluctuation (fluctuation in an index of refraction) of air on the optical path of the laser beam to be supplied to the moving mirror Mw and the reference mirror Mf from the laser interferometer system 12, an air duct 16 having flexibility is fixed to the measurement mount 15. As shown in FIG. 2, the air duct 16 extends substantially parallel to a column 33A, one side of an upper portion column 34, and a wire 35B. Gas such as highly clean air at a controlled temperature and humidity is supplied from a small air conditioning device 17 (see FIG. 2), and the gas is supplied to the optical path of the laser beam of the laser interferometer system 12 by a local downflow method. Furthermore, in order to couple a portion of the air duct 16 with the wire 35B, a fixed mount 16M (support member) is arranged in the vicinity of a movable portion of the wire 35B. A local gas flow system is constituted of the small air conditioning device 17 and the air duct 16. By so doing, the measurement accuracy of the laser interferometer system 12 is improved. Additionally, a plurality of air ducts 16 also can be provided.

In FIG. 1, the movement of the wafer stage WST is performed by a driving system 13 comprising an actuator such as a linear motor, a voice coil motor (VCM), or the like. The measurement information of the laser interferometer system 12 is supplied to the stage control unit 14, and the stage control unit 14 controls the operation of the driving system 13 based on the measurement information and the control information (input information) received from the main control system 20.

Additionally, the wafer stage WST is moved to control its position (focus position) in the Z direction of the wafer W, by a Z-leveling mechanism which also controls an inclination angle about the X and Y axes. Furthermore, an oblique incident type multi-point autofocus sensor (23A, 23B) is fixed to the measurement mount 15 of the lower side surface of the projection optical system PL. The oblique incident type multi-point autofocus sensor (23A, 23B) is composed of a projection optical system 23A which projects a slit image onto a plurality of measurement points on the surface of the wafer W, and a light receiving optical system 23B which detects the information relating to the horizontal shift amount of the image in which these slit images were re-imaged by receiving the reflected light from the surface, and supplies this information to the stage control unit 14. The stage control unit 14 calculates a defocus amount from the image plane of the projection optical system PL in the plurality of measurement points by using the information of the horizontal shift amount of the slit image, and drives the Z leveling mechanism within the wafer stage WST by the autofocus method so that the focus amount is maintained within predetermined control accuracy at the time of exposure. A detailed structure of one type of an oblique incident type multi-point autofocus sensor is disclosed in, e.g., Japanese Laid-Open Patent Application 1-253603.

Furthermore, the stage control unit 14 includes a control system on the reticle side which optimally controls the driving system 11 based on the measurement information received from the laser interferometer system 10, and a control system on the wafer side which optimally controls the driving system 13 based on the measurement information received from the laser interferometer system 12. If the projection exposure apparatus of this example is a scanning exposure type, when the reticle R and the wafer W are synchronously scanned at the time of scanning exposure, both control systems coordinate and control the respective driving systems 11 and 13. Furthermore, the main control system 20 mutually communicates with the respective control systems in the stage control unit 14 with respect to parameters and commands, and the respective control systems in the stage control unit 14, and optimally performs exposure processing in accordance with a program designated by an operator. Because of this, an undepicted operation panel unit (including an input device and a display device) is provided, and forms an interface between the operator and the main control system 20.

Furthermore, at the time of exposure, it is desirable to align the reticle R and the wafer W in advance. Therefore, in the projection exposure apparatus of FIG. 1, a reticle alignment system (RA system) 21 which sets the reticle R at a predetermined position, and an off-axis type alignment system 22 which detects a mark on the wafer W are provided. The alignment system 22 (mark detection system) is fixed to the measurement mount 15. The multi-point autofocus sensors (23A, 23B) and the alignment system 22 can be considered as one sensor which measures the positional relationship between the projection optical system PL and the wafer stage WST or the wafer W (predetermined member).

Furthermore, when the laser light source 1 is an excimer laser light source, a laser control unit 25 which is controlled by the main control system 20 is provided. Laser control unit 25 controls modes (one pulse mode, burst mode, waiting mode, or the like) of pulse oscillation of the laser light source 1, and controls a discharging high voltage of the laser light source 1 in order to adjust an average light amount of the pulse laser light to be radiated. Furthermore, a light amount control unit 27 controls a variable attenuator 4 in order to obtain an appropriate exposure dose based on the signal received from a photoelectric detector 26 (integrator sensor) which receives part of the illumination light divided by the beam splitter 3, and sends intensity (light amount) information of the pulse illumination light to the laser control unit 25 and the main control system 20.

Additionally, in FIG. 1, in the case of a step and repeat exposure type apparatus, an operation which, in the presence of the illumination light IL, projects a pattern of the reticle R onto one shot area on the wafer W via the projection optical system PL, and an operation which step-moves the wafer W via the wafer stage WST in the X and Y directions are repeated by a step-and-repeat method. Meanwhile, in the case of a scanning exposure type apparatus, according to the scanning exposure operation, a pattern image of the reticle R is transferred to the shot area, in a state in which irradiation of the illumination light IL to the reticle R is provided, the image which passed through part of the pattern of the reticle R of the projection optical system PL is projected onto one shot area on the wafer W, and, using projection magnification $\beta$ of the projection optical system PL as a speed ratio, the reticle stage RST and the wafer stage WST are synchronously moved (synchronized scanning) in the Y direction. Then, by repeating the operation in which irradiation of the illumination light IL is stopped and the wafer W is step-moved in the X and Y directions via the wafer stage WST and the above-mentioned scanning exposure operation, the pattern image of the reticle R is transferred onto all of the shot areas on the wafer W by a step-and-scan method.

The following explains the details of a structure of the mechanism portion of the projection exposure apparatus of this example of the invention. This mechanism portion also can be considered as a projection optical device provided with a projection optical system PL. The following explains when the projection exposure apparatus of this example is a step and repeat exposure type.

FIG. 2 shows a schematic structure of the mechanism portion of the projection exposure apparatus of this example. In FIG. 2, short cylindrical seats 32A, 32B (the third seat, 32C, is undepicted) are arranged at three locations located at the vertices of a triangle on the floor surface. Long columns 33A, 33B, 33C are located on the respective three seats 32A, 32B, 32C. The columns are arranged in a state so that position shifting is not generated, thus the thin, long cylindrical columns 33A, 33B, 33C slant inwardly to some degree as shown in FIG. 2 (rather than being perfectly vertical). The three columns 33A-33C are arranged so that the spacing between their upper portions is more narrow than the spacing between their lower ends, and a substantially triangle frame-shaped upper column 34 is fixed on the top surfaces of the columns 33A-33C. A column structural body comprised of the columns 33A-33C and the upper column 34 corresponds to a frame which suspends the projection optical system PL.

That is, the projection optical system PL is arranged within a space surrounded by the columns 33A-33C, and the flange 18 (support member) is integrally fixed to the projection optical system PL so as to substantially surround the side surface of the center in the Z direction of the projection optical system PL. The flange 18 can be integrated with a lens barrel of the projection optical system PL. Additionally, one end of coil springs 36A, 36B, 36C (vibration isolation portions), which are identical to each other, is fixed to the respective center portion of each of the three pieces of the upper column 34. The flange 18 is coupled to the other end of the coil springs 36A, 36B, 36C via wires 35A, 35B, 35C, which are identical to each other and made of metal. The wire 35A and the coil spring 36A correspond to one coupling member. In the same manner, other wires 35B, 35C and coil springs 36B and 36C correspond to two other coupling members. These coupling members are substantially parallel to each other and parallel to the Z axis. In this example, the direction (−Z direction) toward the floor surface is a vertical direction, and a plane (XY plane) perpendicular to the Z axis is a substantially horizontal plane. Therefore, from the upper column 34, the projection optical system PL and the flange 18 are suspended and supported via the three coupling members.

In this case, the optical axis of the projection optical system PL is parallel to the Z axis, and the characteristic frequency of the coupling members of this example is lower in the direction perpendicular to the optical axis than in the direction parallel to the optical axis of the projection optical system PL. The coupling members vibrate like a pendulum in a direction perpendicular to the optical axis, so if the length in the Z direction of the coupling members is L, and the acceleration constant is G (=9.8 m/s$^2$), as shown below, the longer the length L becomes, the lower the characteristic frequency fg in the direction perpendicular to the optical axis becomes.

$$fg = \frac{1}{2\pi}\sqrt{\frac{G}{L}} \qquad (1)$$

The lower the characteristic frequency fg becomes, the better the vibration isolation performance capability (capability which prevents vibration of the floor from being transmitted to the projection optical system PL) in the direction perpendicular to the optical axis of the projection optical system PL becomes. Thus, in order to improve the vibration isolation performance capability, the longer the length L of the coupling members becomes, the better. However, on the other hand, in order to stably support the projection optical system PL, it is preferable that the flange 18 which is suspended by coupling members should be fixed in the vicinity of a center of gravity in the Z direction of the projection optical system PL. Furthermore, in order to optimally reduce the size of the projection exposure apparatus, it is preferable that the height of the upper column 34 should not be higher than the upper end portion of the projection optical system PL. From this perspective, the length L of the coupling members becomes approximately ½ or less of the Z direction length of the projection optical system PL.

As an example, the length L of the coupling members is set to be substantially 0.5 m. If this value is applied to equation (1), the characteristic frequency fg becomes a small value, i.e., 0.7 Hz. Furthermore, if the length L of the coupling members is set to be 1 m or greater, according to equation (1), the characteristic frequency fg becomes approximately 0.5 Hz which is sufficiently low for the vibration isolation performance in the projection exposure apparatus.

$$fg \leq 0.5 (Hz) \qquad (2)$$

Therefore, for example, if it is possible in view of the length of the projection optical system PL, it is preferable that the length of the coupling members be set approximately between 1 m and several m.

Furthermore, the characteristic frequency in the optical axis direction of the projection optical system PL of the wires 35A-35C in the coupling members becomes much higher than the characteristic frequency fg. However, for example, among the vibrations transmitted to the upper column 34 via the columns 33A-33C from the floor, most of the vibration components in the optical axis direction are absorbed by the coil springs 36A-36C (vibration isolation portions), so a high vibration isolation performance capability can be obtained in a direction parallel to the optical axis.

Furthermore, for example, between the columns 33A-33C and the upper column 34, it is possible to arrange a vibration isolation member such as a coil spring or an air damper. In such a case, the coil springs 36A-36C in the coupling members can be omitted.

In addition, in this example, the reticle stage RST (here, micro-moving mechanism) is integrally fixed to the upper portion of the projection optical system PL. The reticle R (member in which a pattern is formed) is held by the reticle stage RST. The reticle stage RST is provided with a base portion 31B fixed to the projection optical system PL, an X stage 31X which can be micro-moved in the X direction with respect to the base portion 31, and a Y stage 31Y which can be micro-moved in the Y direction with respect to the X stage 31× and that holds the reticle R. On the pattern formation surface of the reticle R of this example, a pair of alignment marks RMA and RMB are formed at a predetermined interval in the X direction. Reticle alignment systems (RA system) 21A, 21B are arranged above the alignment marks RMA, RMB via the respective mirrors 28A, 28B. The pair of RA systems 21A, 21B corresponds to the RA system 21 of FIG. 1.

The projection exposure apparatus of this example is a step and repeat exposure type, and before exposure, after positioning of the alignment marks RMA and RMB of the reticle R by using the RA systems 21A, 21B, it is not necessary to move the reticle R. Because of this, the laser interferometer system 10 on the reticle side of FIG. 1 is not provided in the projection exposure apparatus of FIG. 2.

Furthermore, the mirrors 28A, 28B, and the RA systems 21A, 21B are fixed to an undepicted column coupled with the upper column 34, and an illumination system sub-chamber 19 which stores the illumination optical system 9 of FIG. 1 is fixed with respect to the column. In this case, the laser light source 1 of FIG. 1 is arranged on the floor outside the columns 33A-33C of FIG. 2 as an example, and the illumination light IL to be emitted from the laser light source 1 is guided to the illumination optical system 9 via an undepicted beam transmitting system.

In addition, a wafer base WB is arranged via a vibration isolation table (undepicted) on the floor surface below the projection optical system PL, and the wafer stage WST which holds the wafer W on the wafer base WB is movably arranged thereon via an air bearing. On top of the wafer stage WST, a reference mark member 29 is fixed in which a reference mark is formed to perform alignment of the reticle R and the wafer W.

Thus, the projection optical system PL having a rigid structure of this example is suspended and supported via the coil springs 36A-36C and the wires 35A-35C, which function as coupling members having a flexible structure, with respect to the upper column 34, which has a rigid structure. In this structure, a high vibration isolation performance capability can be obtained, and the mechanism portion can be significantly lightened. However, there is a possibility that the relative position of the projection optical system PL and the upper column 34 can change at a relatively low frequency of vibration. Therefore, in order to maintain the relative position of the projection optical system PL and the upper column 34 (and the columns 33A-33C) in a predetermined state, as shown in FIG. 3, a positioning device of a non-contact type is provided.

Figure 3:
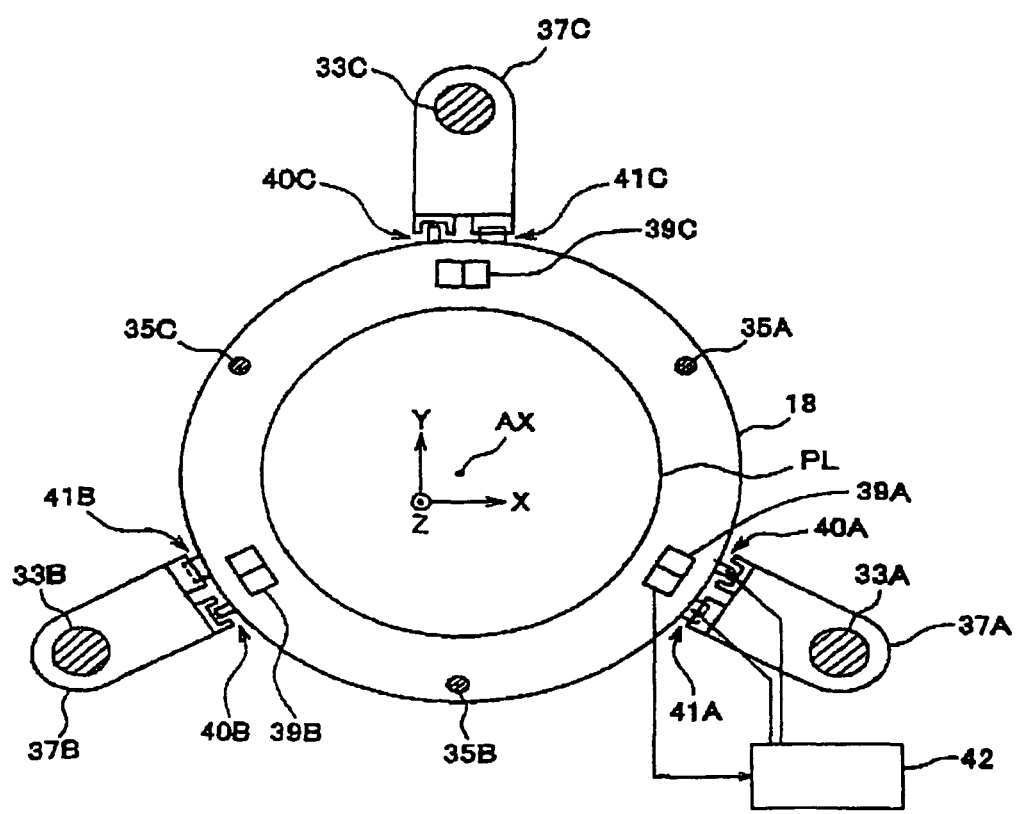
FIG. 3 is a plan view which cuts through a portion showing a flange 18 and a projection optical system PL of FIG. 2.

FIG. 3 is a plan view of the projection optical system PL and the flange 18 of FIG. 2. In FIG. 3, arm portions 37A, 37B, 37C, which extend toward the flange 18 are fixed to the columns 33A, 33B, 33C. The arm portions 37A-37C are arranged at a substantially 120° interval about the optical axis AX of the projection optical system PL. Furthermore, between the first arm portion 37A and the flange 18, a first actuator 40A which displaces the flange 18 in the Z direction and a second actuator 41A which displaces the flange 18 in a circumferential direction are provided. Voice coil motors can be used for the actuators 40A, 41A. In addition, a non-contact electromagnetic actuator, e.g., an EI core type or the like, also can be used as actuators 40A and 41A.

Additionally, on the flange 18 in the vicinity of the arm portion 37A, a first biaxial acceleration sensor 39A is provided, which detects acceleration in the Z direction and in the circumferential direction of the flange 18. The biaxial acceleration information detected by the acceleration sensor 39A is supplied to a controller 42, and the controller 42 drives the actuators 40A, 41A so that the flange 18 can be maintained stationary with respect to the arm portion 37A (and thus the upper column 34 of FIG. 2) or the earth based on the acceleration information.

In FIG. 3, between the second arm portion 37B and the flange 18, and between the third arm portion 37C and the flange 18 as well, third and fifth actuators 40B and 40C are provided which displace the flange 18 in the Z direction, and fourth and sixth actuators 41B and 41C are provided which displace the flange 18 in the circumferential direction. The structures of the actuators 40B, 41B and 40C, 41C are the same as the actuators 40A, 41A. Furthermore, on the flange 18 in the vicinity of the arm portions 37B and 37C, the second and third biaxial acceleration sensors 39B and 39C are provided, which detect the acceleration in the Z direction and in the circumferential direction of the flange 18. The acceleration information of the acceleration sensors 39B and 39C also is supplied to the controller 42, and the controller 42 drives the actuators 40B, 41B and 40C, 41C so that the flange 18 can be maintained relatively stationary with respect to the respective arm portions 37B and 37C (and thus the upper column 34 of FIG. 2) or the earth based on the acceleration information.

As acceleration sensors 39A-39C, displacement sensors, a piezoelectric type acceleration sensor which detects a voltage generated by a piezoelectric element or the like, a semiconductor type acceleration sensor which monitors changes of a logical threshold value voltage of a CMOS converter, e.g., according to the displacement and distortion of the mass, or the like can be used. In addition to (or instead of) using the acceleration sensors 39A-39C, a position sensor is used, which directly measures the relative position between the flange 18 and the arm portions 37A-37C (and thus the upper column 34). A position sensor, for example, an eddy current displacement sensor, a capacitance type displacement sensor, an optical type sensor, or the like can be used.

Thus, the positioning device of the projection optical system PL and the flange 18 is constituted by the six-axis acceleration sensors 39A-39C (displacement sensors), the six-axis actuators 40A-40C, 41A-41C, the six position sensors and the controller 42. By this positioning device, the relative position, in the X, Y and Z directions, of the projection optical system PL with respect to the upper column 34, and the relative rotation angles about the X, Y, and Z axes are maintained in a constant state (predetermined state). The response frequency of the actuators 40A-40C, 41A-41C is approximately 10 Hz, and thus with respect to vibrations up to the response frequency, the projection optical system PL of this example is supported by an active suspension method. Furthermore, with respect to vibrations of a frequency which exceeds this, the projection optical system PL is suspended and supported by a passive vibration isolation structure.

In FIG. 3, the three columns 33A-33C are used. However, as shown in FIG. 4, four columns 33A-33D also can be used.

Figure 4:
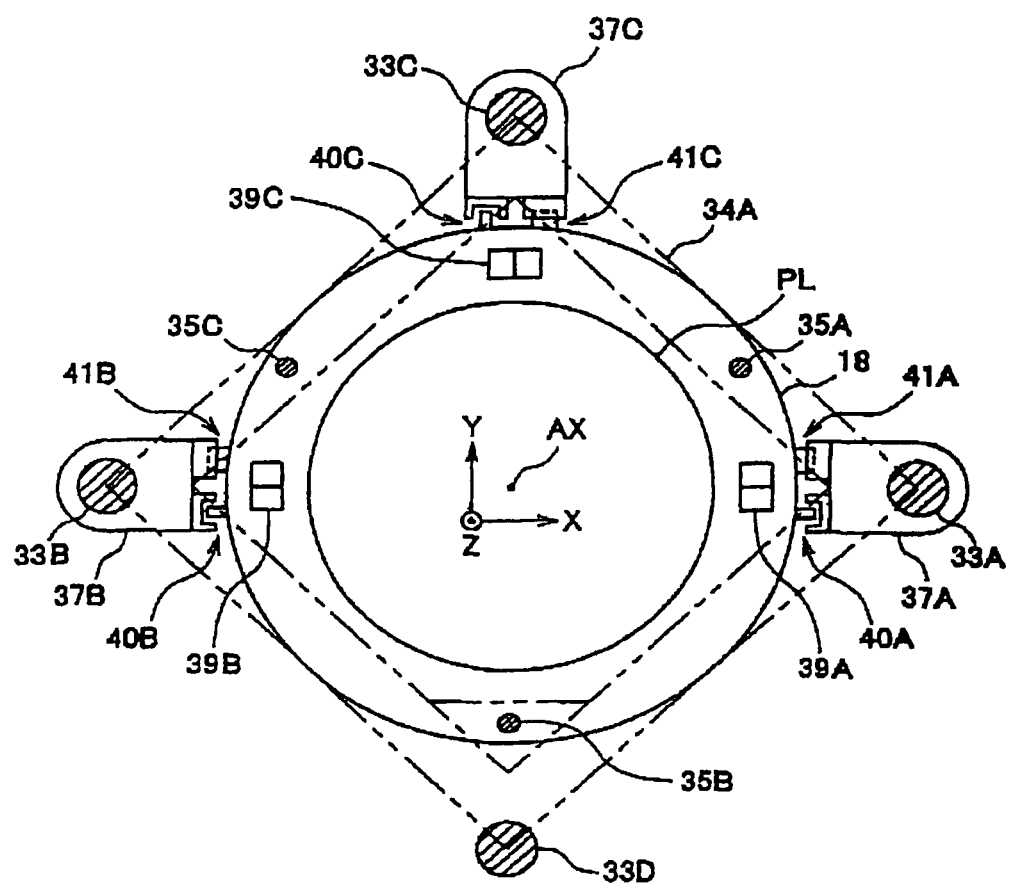
FIG. 4 is a plan view which cuts through a portion showing a modified example of FIG. 3.

FIG. 4 is a plan view showing the projection optical system PL and the flange 18 when the four columns 33A-33D are used. In this figure, the columns 33A-33D are stably arranged so that their spacing at their upper portion is narrower at a position of vertices of a substantially square shape, compared to at the lower ends of the columns 33A-33D. Furthermore, a square frame-shaped upper column 34A is fixed to the upper portion of the columns 33A-33D, and the wires 35A-35C which suspend the flange 18 are coupled to three locations of the upper column 34A via the coil springs 36A-36C of FIG. 2.

In this case, the two columns 33A and 33B are arranged so as to sandwich the projection optical system PL in the X direction, and the column 33C is arranged in the +Y direction of the projection optical system PL. In addition, between the flange 18 and the arm portion 37A fixed to the column 33A, the first and second actuators 40A, 41A are provided which drive the flange 18 in the Z and Y directions, respectively, and the third and fourth actuators 40B, 41B which drive the flange 18 in the Z and Y directions, respectively are provided on arm portion 37B. Furthermore, between the flange 18 and the arm portion 37C fixed to the column 33C, the fifth and sixth actuators 40C and 41C are provided which drive the flange 18 in the Z and X directions, respectively. Furthermore, the biaxial acceleration sensors 39A-39C are arranged on the upper portion of the flange 18 in the vicinity of the arm portions 37A-37C.

In the structure of FIG. 4, the projection optical system PL (and the flange 18) can be driven in the X direction by the actuator 41C, and the projection optical system PL (and the flange 18) can be driven by the actuators 41A, 41B in the Y direction and in the rotation direction about the Z axis, so the actuators 41A-41C can be easily controlled.

In FIG. 2, on the bottom surface of the flange 18 (support member) of the projection optical system PL, an annular flat-shaped measurement mount 15 (measurement unit) is coupled via the three cylindrical rods 38A, 38B, 38C (link members), which extend substantially parallel to the Z axis. That is, the measurement mount 15 is stably coupled to the flange 18 by a kinematic support method comprised of a semi-three-point support. The alignment system 22, the air duct 16, and the laser interferometer system 12 are fixed to the measurement mount 15.

Figure 5A:
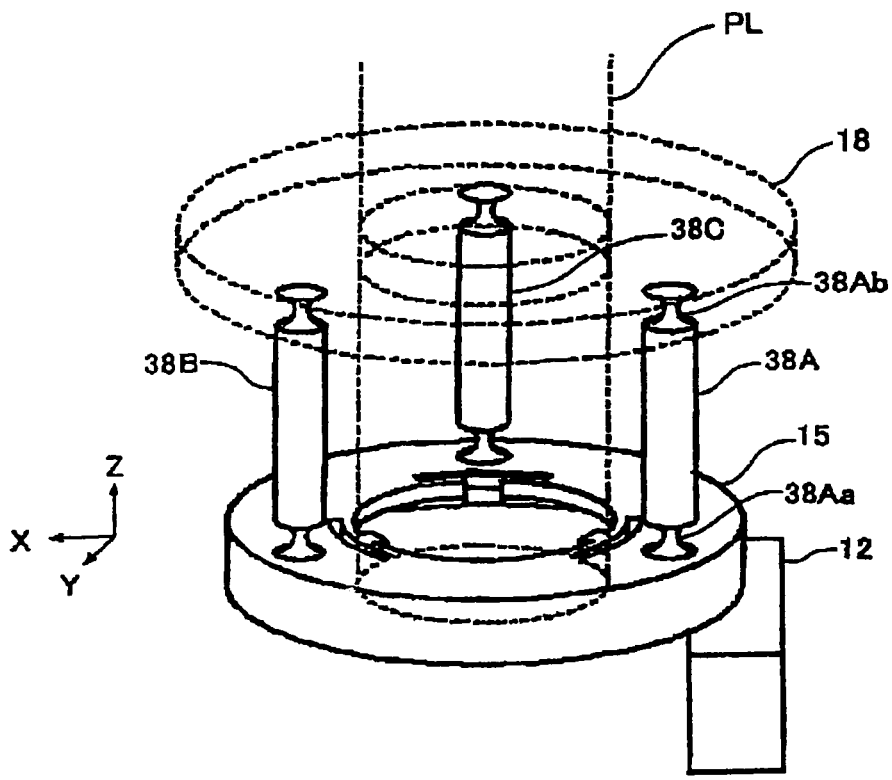
FIG. 5A is a perspective view showing a coupling state of the flange 18 and a measurement mount 15 of FIG. 2.

FIG. 5A shows a state in which the flange 18 and the measurement mount 15 of FIG. 2 are coupled via the rods 38A-38C. In FIG. 5A, flexures 38Ab and 38Aa whose diameters are made small are formed in both end portions of the rod 38A. Flexures also are formed on both end portions of the two other rods 38B, 38C.

Figure 5B:
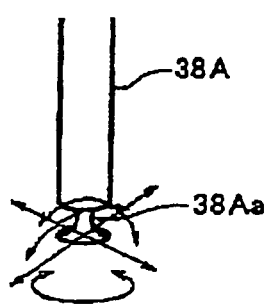
FIG. 5B is a perspective view showing a lower end portion of a rod 38A of FIG. 5A.

As shown in FIG. 5B, in one flexure 38Aa of the rod 38A, displacement in the five degrees-of-freedom other than expansion in the Z direction is possible. In the same manner, displacement in five degrees-of-freedom also is possible in the other flexure 38Ab of the rod 38A of FIG. 5A, and in the flexures of both end portions of the other two rods 38B, 38C. Thus, virtually no stress is applied between the flange 18 and the measurement mount 15. Therefore, high measuring accuracy can be obtained in the laser interferometer system 12 or the like fixed to the measurement mount 15.

Furthermore, a slot and a pad are formed at three locations in the vicinity of the aperture at the center of the measurement mount 15 (the aperture into which the projection optical system PL is inserted), and the three pads contact the side surface of the projection optical system PL.

Figure 5C:
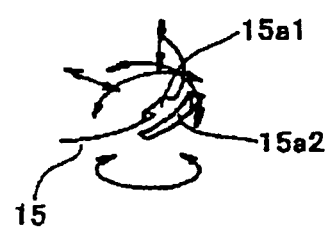
FIG. 5C is a perspective view showing a convex portion and a notch portion within the measurement mount 15 of FIG. 5A.

FIG. 5C shows a slot 15a2 and a pad 15a1 of the measurement mount 15 as a flexure. Because of this structure, the pad 15a1 allows displacement in five degrees-of-freedom including the displacement in the Z direction and in the radius direction about the optical axis with respect to the side surface of the projection optical system PL, and displacement in the rotation direction about the Z, X and Y axes. Therefore, virtually no stress is applied between the measurement mount 15 and the projection optical system PL, so the imaging characteristic of the projection optical system PL can be stably maintained.

Figure 6:
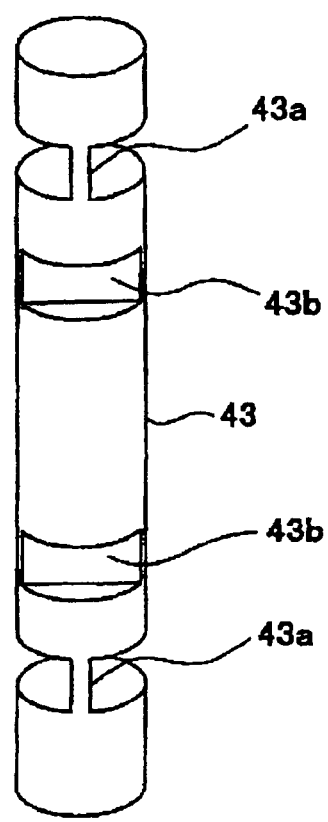
FIG. 6 is a perspective view showing a rod 43 which can be used instead of rods 38A-38C of FIG. 5A.

Furthermore, instead of the rods 38A-38C in which the flexures are formed on both end portions as shown in FIG. 5A, a rod 43 (link member) shown in FIG. 6 can be used. In FIG. 6, in the upper end portion of the rod 43, slots 43a, 43b are formed in two perpendicular directions, and the lower end portion of the rod 43 is fixed to a member (in the example of FIG. 5A, the measurement mount 15), and includes slots 43b, 43a, which are symmetrical to the upper end portion. Even if the rods 38A-38C of FIG. 5A are replaced with three rods that are the same as the rod 43 of FIG. 6, at least displacement in five degrees-of-freedoms is possible in both end portions of the rod 43, so the flange 18 and the measurement mount 15 are coupled in a state in which virtually no stress is applied (i.e., they are attached using a kinematic support method).

In FIG. 2, the projection exposure apparatus of this example is arranged in a downflow environment, and a predetermined gas (e.g., air) having a controlled temperature and humidity, and being subjected to particle prevention processing, is supplied to the wafer base WB via the side surface of the projection optical system PL, from the illumination system sub-chamber 19 side. The projection optical system PL of this example is suspended and supported by the upper column 34, and there are no members in the way that would prevent predetermined gas flow. Therefore, the predetermined gas can be supplied smoothly in the downward direction, the temperature stability of the projection optical system PL is improved, and the stability of the imaging characteristics is improved.

Thus, in the projection exposure apparatus of FIG. 2 of this example, the projection optical system PL and the flange 18 of a rigid structure are suspended and supported by an active suspension method via the coil springs 36A-36C and the wires 35A-35C, as coupling members having a flexible structure, with respect to the upper column 34, which has a rigid structure. Because of this, the following advantages are possible.

(1) The projection exposure apparatus of this example is constituted by an extremely simplified structural body, the mechanism portion can be lightened, and the manufacturing cost can be reduced.

(2) The projection optical system PL is suspended and supported, and particularly the characteristic frequency of vibration in the direction perpendicular to the optical axis of the coupling member (projection optical system PL) is extremely low, so the effects of vibrations from the floor surface are significantly reduced. Therefore, an apparatus performance capability, such as a vibration isolation performance capability, exposure accuracy (overlay accuracy), or the like can be improved. Furthermore, even if vibration becomes an issue, the vibration transmission path can be easily identified, and for example, a countermeasure can be easily performed, e.g., in which a vibration isolation member is added to the portion in which vibration is transmitted, or the like.

(3) When the environment temperature of the projection exposure apparatus changes, thermal deformation of the structural body also can be easily predicted, so by using a temperature sensor, and measuring the temperature of each part of the structural body, based on the measurement result, a positioning error or the like can be corrected.

(4) There is a large space in the vicinity of the projection exposure apparatus. Thus, when the next generation exposure apparatus is designed and customized, there is no need to change a platform (a support mechanism or the like of a base, a column, and a projection optical system). Therefore, the degree of freedom for design becomes large, and a preferable structure is possible for a so-called modular design.

Second Embodiment

Figure 7:
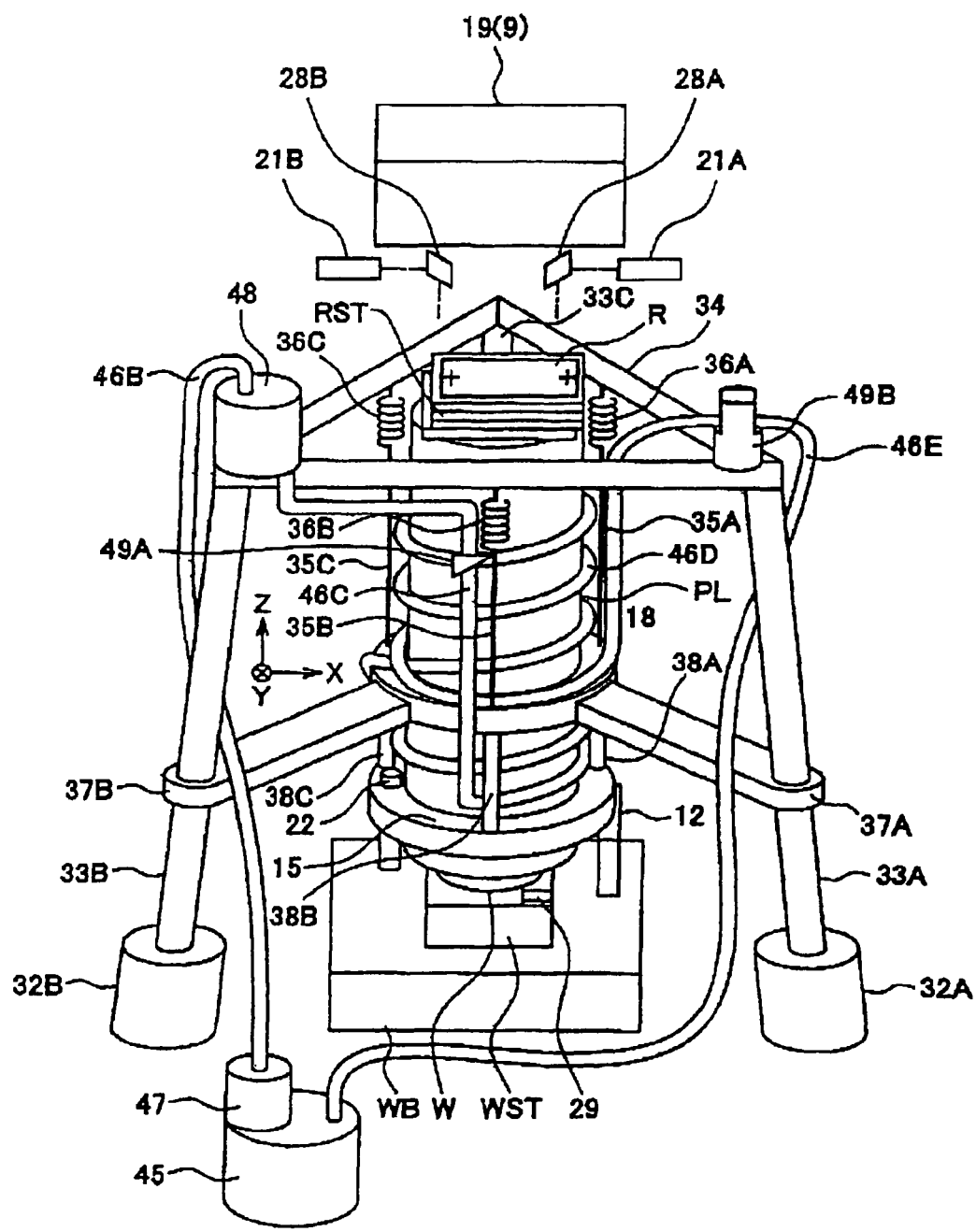
FIG. 7 is a perspective view showing a schematic structure of a mechanism portion of a projection exposure apparatus of a second exemplary embodiment of this invention.
Figure 8:
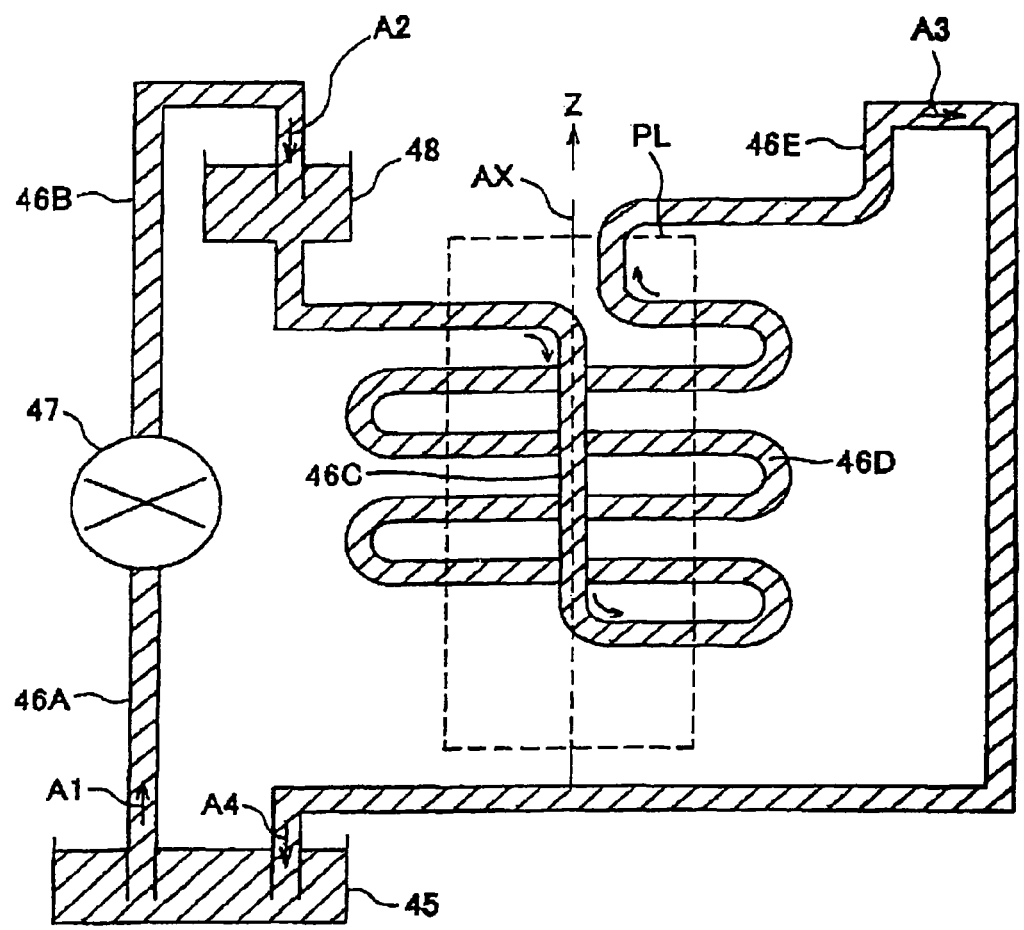
FIG. 8 is a diagram showing a liquid supply system of FIG. 7.

The following explains a second exemplary embodiment of this invention with reference to FIGS. 7 and 8. With respect to the projection exposure apparatus of this example, a mechanism which stabilizes the temperature of the projection optical system PL is added to the projection exposure apparatus of FIG. 2. In FIGS. 7 and 8, the same symbols are used for the portions corresponding to the portions of FIG. 2, and their detailed description is omitted. Furthermore, in FIG. 7, in order to clarify understanding of the additional structure, the air duct 16 and the small air conditioning device 17 of FIG. 2 are omitted.

FIG. 7 shows a schematic structure of a mechanism portion of the projection exposure apparatus of this example. In FIG. 7, a recovery tank 45 which collects a cooling liquid is provided on the floor, a supply tank 48 which stores the liquid is provided in the vicinity of one vertex of the triangle frame-shaped upper column 34, and a support member 49B which connects later-mentioned tubes, is provided in the vicinity of another vertex of the upper column 34. As a cooling liquid, water or a fluorine group inert liquid (e.g., FLUORNERT (manufactured by U.S. 3M Corporation)) can be used. A so-called coolant also can be used as the liquid. In terms of environment, water is preferable as the liquid.

The recovery tank 45 is coupled to a pipe 46A (see FIG. 8), which is coupled to a temperature control device which adjusts the temperature of the liquid passing through its inside to a target temperature and which houses a pump 47, which in turn is coupled to the upper portion of the supply tank 48 via the pipe 46B. The bottom portion of the supply tank 48 is coupled to the pipe 46D via the pipe 46C which is downwardly extended along the wire 35B. The pipe 46D includes a pipe which cools the projection optical system PL from a downward direction to an upward direction of the projection optical system PL, and is coupled to the pipe 46E via a pipe which extends along the flange portion 18 toward the upper portion of the projection optical system PL. The pipe 46E includes a pipe which is upwardly extended along the wire 35A and is coupled to the recovery tank 45. Part of the pipe 46C is held by the fixed mount 49A (support member) which is fixed to the movable portion of the wire 35B, and the pipe 46E is fixed by a fixed mount (undepicted) attached to the movable portion of the coil spring 36A. After the pipe 46E is fixed by the support member 49B, it extends along the column 33A.

The pipes 46A-46E are formed of composite resin or the like having flexibility, and the height of the supply tank 48 is greater than that of the recovery tank 45, so even if the pipe moves up and down, as described later, the cooling liquid can be circulated by a siphon principal (an operation which pushes the liquid out by using height difference) between the supply tank 48 and the recovery tank 45. Thus, the liquid supply device includes the recovery tank 45, the pipes 46A-46E, the temperature control device housing a pump 47, and the supply tank 48.

FIG. 8 shows the liquid flow provided by the liquid supply device of FIG. 7. In FIG. 8, the liquid within the recovery tank 45 is suctioned by the pipe 46A as shown by an arrow A1 due to the pump 47 housed in the temperature control device. After being cooled in the temperature control device, the liquid is supplied to the supply tank 48 via the pipe 46B as shown by an arrow A2. Then, the liquid within the supply tank 48 flows into the pipes 46C-46E as shown by arrows A3-A4 and is collected by the recovery tank 45. At this time, depending on the case, there is a possibility that the pipe 46E goes through a position higher than the tank 48, but once the liquid begins circulating, the circulation is maintained by the siphon principle. Therefore, when the cooling liquid is supplied to the side surface of the projection optical system PL, a vibration source does not exist because the liquid is pushed out by using the gravitational force caused by the height difference only, so a vibration control performance capability does not deteriorate.

Third Embodiment

Figure 9:
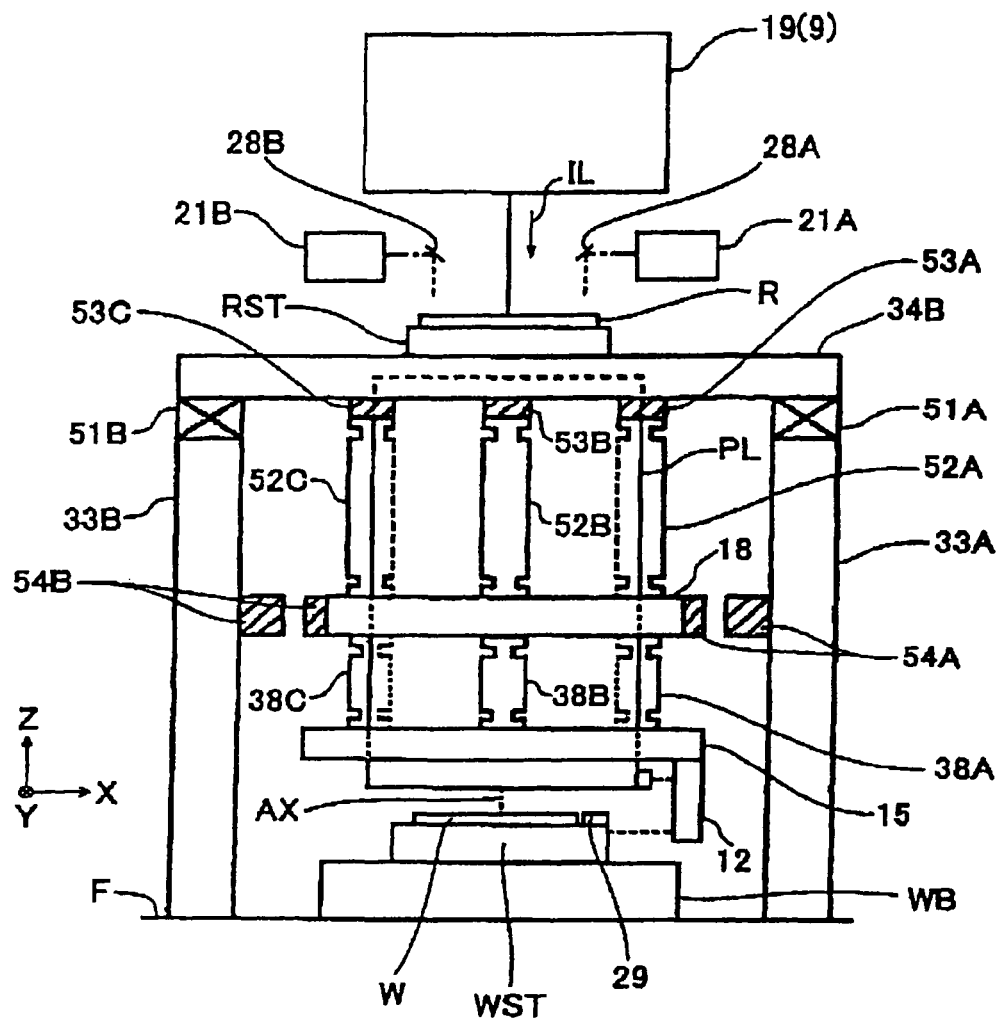
FIG. 9 is a schematic structural view showing a mechanism portion of a projection exposure apparatus of a third exemplary embodiment of this invention.

The following explains a third embodiment of this invention with reference to FIG. 9. In this example, in the same manner as in the embodiment of FIG. 2, this invention is applied to a step and repeat exposure type projection exposure apparatus. In FIG. 9, the same symbols are used for the portions corresponding to the portions of FIG. 2, and their detailed description is omitted.

FIG. 9 shows a schematic structure of a mechanism portion of the projection exposure apparatus of this example. In FIG. 9, three columns 33A, 33B (the third column, 33C, is undepicted) are fixed to the floor F (which also could be a supporting frame located on a floor), and extend parallel to the Z axis. The upper column 34B is supported on the columns 33A, 33B, 33C via passive-type vibration isolation members 51A, 51B (and undepicted 51C), which include, for example, an air damper and/or a coil spring. Furthermore, the flange 18 (support member) is integral with the projection optical system PL, and is fixed thereto so as to surround the side surface at substantially the center of the projection optical system PL in the Z direction. Vibration isolation members 53A, 53B, 53C, e.g., a leaf spring, are fixed to three locations of the upper column 34B. Furthermore, from the vibration isolation members 53A, 53B, 53C, the flange 18 (and thus the projection optical system PL) is suspended via rods 52A, 52B, 52C, which are substantially parallel to the Z axis, and in which flexures which are identical to each other are formed on both ends.

In this case, the vibration isolation member 53A and the rod 52A correspond to one coupling member. In the same manner, the other vibration isolation members 53B, 53C and rods 52B, 52C correspond to two other coupling members. These coupling members are substantially parallel to each other and parallel to the Z axis. In this example, the rods 52A-52C can be easily displaced in a direction perpendicular to the optical axis AX of the projection optical system PL, so the characteristic frequency of the coupling members is lower in the direction perpendicular to the optical axis than in the direction parallel to the optical axis AX of the projection optical system PL, in the same manner as in the first embodiment. The length L of the coupling members is set at substantially 0.5 m for example. If this value is applied to equation (1), the characteristic frequency of the coupling members in the direction perpendicular to the optical axis AX becomes a small value, e.g., approximately 0.7 Hz. Furthermore, if the length L of the coupling members is set at 1 m or greater, according to equation (1), the value becomes approximately 0.5 Hz or less, which is suitable for the characteristic frequency of the projection exposure apparatus.

Furthermore, the characteristic frequency in the optical axis AX direction of the rods 52A-52C within the coupling members is considerably greater than the characteristic frequency in the direction perpendicular to the optical axis AX. However, for example, most of the vibration transmitted to the columns 33A, 33B, 33C from the floor is attenuated by the vibration isolation members 51A, 51B, 51C, and thus the vibration in the optical axis AX direction is hardly transmitted to the upper column 34B. Thus, the projection optical system PL is stably supported.

Furthermore, in order to control the relative position of the flange 18 and the projection optical system PL with respect to the columns 33A, 33B, 33C, between the columns 33A, 33B, and 33C and the flange 18, the biaxial actuators 54A and 54B (and undepicted 54C) are arranged which control the relative position in the Z direction and in the circumferential direction. Furthermore, position sensors (undepicted) for measuring the position in six degrees-of-freedom are arranged on the flange 18. Based on the measurement information of the position sensor, by driving the six-axes actuators, the relative position of the flange 18 and the projection optical system PL is controlled.

Other parts of the structure are the same as in the first embodiment of FIG. 2. In this example as well, the reticle stage RST which micro-moves the reticle R is integrally fixed to the projection optical system PL, and the measurement mount 15 is supported by a kinematic support method via the three rods 38A-38C from the bottom surface of the flange 18. The laser interferometer system 12, or the like, is fixed to the measurement mount 15. Furthermore, the image of the whole reticle R pattern is transferred to the respective shot areas on the wafer W via the projection optical system PL.

According to this example, the projection optical system PL is suspended and supported by the upper column 34B. Therefore, in the same manner as in the first embodiment, a vibration isolation performance capability can be improved, and the mechanism portion can be lightened. Furthermore, the rods 52A-52C are used as coupling members, so even when the projection optical system PL is heavy, the projection optical system PL can be stably supported.

Fourth Embodiment

Figure 10:
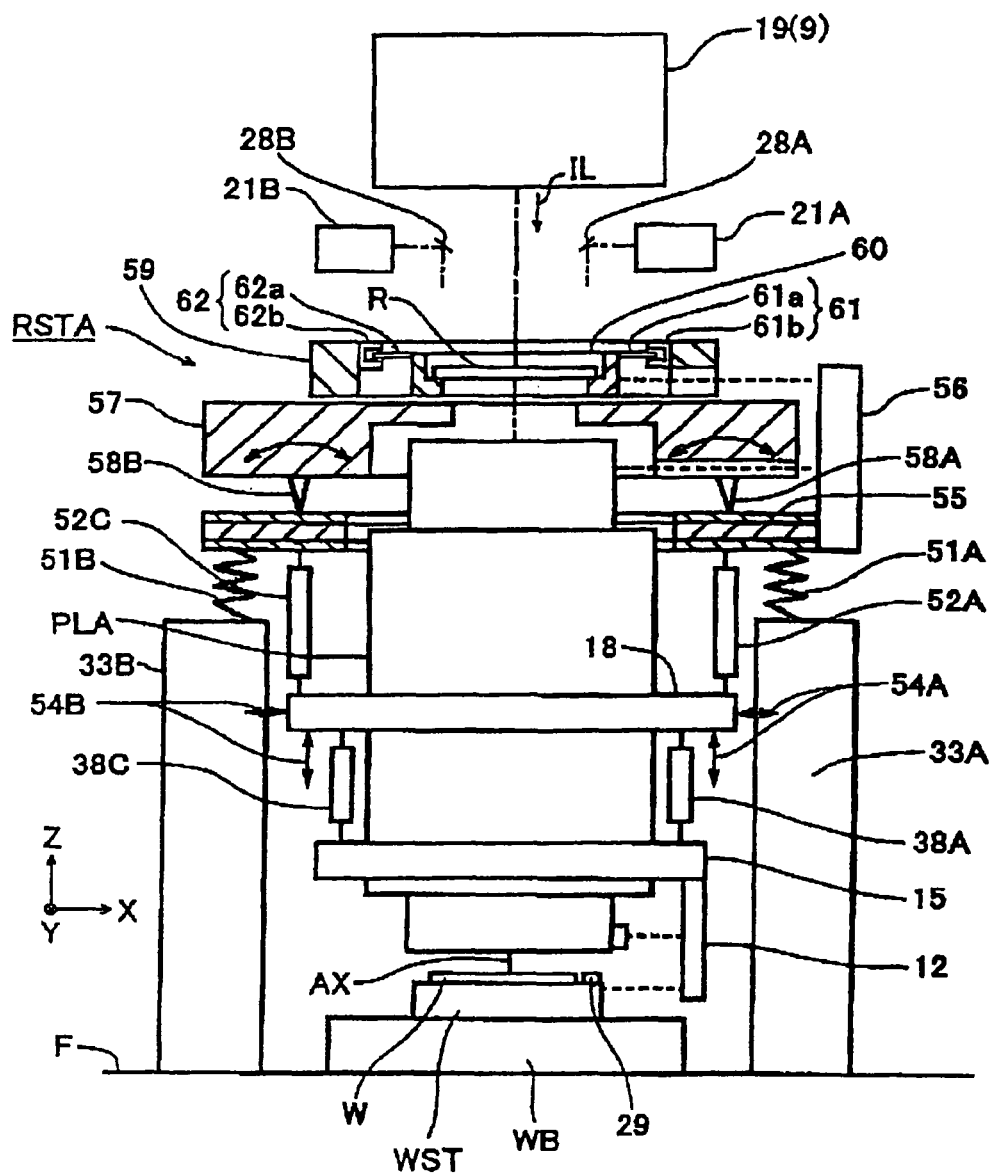
FIG. 10 is a schematic structural view which cuts through a portion showing a mechanism portion of a projection exposure apparatus of a fourth exemplary embodiment of this invention.
Figure 11:
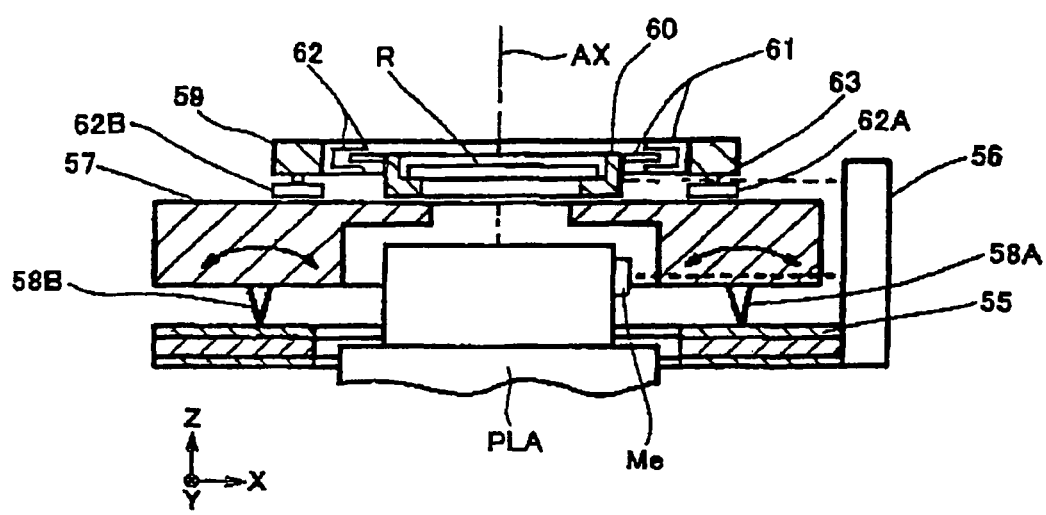
FIG. 11 is an enlarged cross-sectional view showing members from a countermass 59 to an intermediate member 55 of FIG. 10.

The following explains a fourth exemplary embodiment of this invention with reference to FIGS. 10 and 11. In this example, this invention is applied to a scanning exposure type projection exposure apparatus. In FIGS. 10 and 11, the same symbols are used for the portions corresponding to the portions of FIGS. 2 and 9, and their detailed description is omitted.

FIG. 10 shows a schematic structure of a mechanism portion of a projection exposure apparatus of this example. In this figure, the three columns 33A, 33B (the third column, 33C, is undepicted) are fixed to the floor F (or a frame located on the floor), and extend parallel to the Z axis. An intermediate member 55, which has a flat shape and can be elastically deformed to some degree, and in which an aperture into which an end portion of the projection optical system PL is inserted, is supported on the columns 33A-33C via the passive type vibration isolation members 51A, 51B (and undepicted 51C). Furthermore, the flange 18 (support member) is integrally provided with the projection optical system PLA, and is fixed thereto so as to surround the side surface at substantially the center, in the Z direction, of the projection optical system PLA of this example. The flange 18 and the projection optical system PLA are suspended via the three rods 52A, 52B, 52C (the rod 52B is positioned in front of the projection optical system PLA in the same manner as in the example of FIG. 9, and is not depicted in FIG. 10), which are identical to each other and extend substantially parallel to the Z axis, at three locations from the intermediate member 55. Flexures are formed on both end portions of the rods 52A-52C. In this case, the rods 52A-52C correspond to three coupling members, and a column mechanism body including the columns 33A, 33B, 33C the vibration isolation members 51A, 51B, 51C and the intermediate member 55 corresponds to a frame which suspends these coupling members.

Furthermore, for example, via rotatable pivots 58A, 58B (a third pivot (58C) is undepicted) (vibration isolation members) at three locations of the upper surface of the intermediate member 55, a reticle base 57 is provided which is a thick, flat plate, and in which an aperture is formed for passing illumination light beam IL. On the reticle base 57, via an air bearing, a reticle stage 60 is provided which adsorbs and holds the reticle R so as to be movable within the XY plane. The scanning direction of the reticle R during scanning exposure of this example is the Y direction (direction perpendicular to the paper plane of FIG. 10), and in order to cancel a reaction force generated when the reticle stage 60 is driven in the Y direction, a rectangular frame-shaped countermass 59 is provided on the reticle base 57, so as to surround the reticle stage 60. Furthermore, a first Y-axis linear motor 61 is constituted by a movable part 61a located at the end portion in the +X direction of the reticle stage 60, and a stator 61b located on (or in) the countermass 59. In symmetry to this linear motor 61, a second Y-axis linear motor 62 is constituted by a movable part 62a located at the end portion in the −X direction of the reticle stage 60, and a stator 62b located on (or in) the countermass 59. The first and second Y-axis linear motors 61 and 62 each drive the reticle stage 60 in the Y direction with respect to countermass 59. At this time, the countermass 59 moves in the opposite direction, so the driving reaction force is canceled, and the generation of vibration is controlled. This is not depicted, but the reticle stage 60 also can be provided with a micro-moving mechanism for the rotation directions about the X, Y, and Z axes.

Furthermore, a measurement mount 56 is fixed to the intermediate member 55, and in this measurement mount 56, based on a reference mirror Me (see FIG. 11) on the side surface of the projection optical system PLA, a laser interferometer system 10 (similar to FIG. 1) is incorporated which measures the position in the rotation direction about the X, Y, and Z axes of the reticle stage 60. Additionally, a reticle stage system RSTA which drives the reticle R includes the intermediate member 55, the reticle base 57, the reticle stage 60, the countermass 59, and the measurement mount 56.

FIG. 11 shows an enlarged cross-sectional view of the members from the countermass 59 to the intermediate member 55 of FIG. 10. In FIG. 11, the countermass 59 is arranged on the reticle base 57 via a plurality of air pads 62A, 62B (others are omitted). In this structure, the air pads 62A, 62B are smoothly moved on the reticle base 57 by an air bearing method. Furthermore, the bottom surface of the countermass 59 and the air pads 62A, 62B are each coupled via a flexure 63 (flexure mechanism), which is a member having a cross-sectional area that is small, in a state in which relative rotation is possible to a degree.

In FIG. 10, in this example as well, in order to control the relative position in the six degrees-of-freedom of the flange 18 and the projection optical system PLA with respect to the columns 33A, 33B, 33C, six-axis non-contact actuators 54A, 54B (the remaining biaxial actuators are not depicted) are arranged. Other mechanisms are the same as in the embodiment of FIG. 9, and the measurement mount 15 is coupled to the bottom surface of the flange 18 by a kinematic support method, and the laser interferometer system 12 or the like is fixed to the measurement mount 15.

In this example, the pattern of the reticle R is transferred and exposed onto the respective shot areas on the wafer W via the projection optical system PLA by a step-and-scan method. At this time, the projection optical system PLA is suspended and supported from the intermediate member 55, so in the same manner as in the first embodiment, the vibration isolation performance capability can be improved, and the mechanism portion can be lightened.

In addition, in this example, the countermass 59 is arranged so as to cancel a reaction force generated when the reticle stage 60 is driven at a high speed (or acceleration) in the Y direction. At this time, if the countermass 59 is simply arranged on the reticle base 57, there is a possibility that the countermass 59 which receives a reaction force generates a vibration at a high frequency, which vibrates the reticle base 57, and the measurement accuracy of the position of the reticle stage 60 may be deteriorated. In order to prevent this, in this example, as shown in FIG. 11, the countermass 59 (rigid structure) and the air pads 62A, 62B (rigid structure) are coupled via the flexure 63 (flexible structure), so the vibration generated by the countermass 59 is hardly transmitted to the reticle base 57, and the position and the speed of the reticle stage 60 can be controlled with high accuracy.

In the same manner, as shown in FIG. 10, the intermediate member 55 and the reticle base 57 (rigid structure) are coupled via the pivots 58A, 58B (flexible structure), so the vibration of the reticle base 57 is not transmitted to the measurement mount 56, which is provided with a laser interferometer system. Thus, from this perspective as well, the position and the speed of the reticle stage 60 can be controlled with high accuracy.

In other words, in this example, flexible coupling is performed by the flexure 63 so that the moment by the vibration of the countermass 59 is not transmitted to the reticle base 57, which is another structural body. Furthermore, flexible coupling is achieved by the pivots 58A, 58B so that the moment by the vibration of the reticle base 57 is not transmitted to the intermediate member 55 which is another structural body. Because of this, instead of the pivots 58A, 58B, a flexure mechanism also can be used. Support through this type of flexible structure also can be called "kinematic support" (including semi-kinematic support and pseudo-kinematic support for avoidance of stress concentration and for vibration attenuation).

In this case, as shown in FIG. 10, for example, when the reticle base 57 is vibrated, the position of the node of the first vibration mode is not displaced. Only the rotation moment is generated, and flexible coupling is achieved which allows rotation due to the pivots 58A, 58B. Therefore, virtually no vibration energy is transmitted to the intermediate member 55 or to the measurement mount 56.

This type of structure is used, and the measurement mount 56 having a laser interferometer system which monitors the position of the reticle stage 60 is provided in the intermediate member 55 instead of in the reticle base 57. Therefore, for example, Abbe errors (errors determined by the sine of a curved angle) due to the bow of the reticle base 57 can be reduced. Furthermore, the projection optical system PLA is suspended from the intermediate member 55, so flexible coupling is achieved in the horizontal direction, which further shields vibration transmission.

Meanwhile, the vibration shielding effect is relatively small in the vertical direction (Z direction). Thus, ideally, a structure is desirable in which the reticle base 57 is loaded on the vibration isolation member, and its position is actively controlled. For this purpose, for example, in FIG. 10, the reticle base 57 can be supported via three active type vibration isolation members on an undepicted column. These active vibration isolation members include an air damper and an electromagnetic damper (such as a voice coil motor) which generates a variable thrust in the Z direction. In this structure, with respect to the three active vibration isolation members for the reticle base 57, only three degrees-of-freedom (the position in the Z direction, pitching angle, and rolling angle) in the vertical direction can be controlled with respect to the projection optical system PLA. The control band range is, for example, approximately 10 Hz.

If flexible coupling by this type of active vibration isolation member is used, there is no relative interference of vibration energy, fluctuation load, and thermal displacement between the reticle base 57 (reticle stage 60) and the projection optical system PLA. Furthermore, active relative positioning of the rigid structures is performed, so there is no problem due to flexible coupling. In particular, in the case of the scanning exposure apparatus of this example, if a function is provided in which the reticle base 57 and the projection optical system PLA are coupled by the above-mentioned flexible mechanism, and positioning is actively performed with respect to each other, the support mechanism which supports the reticle base 57 and the projection optical system PLA does not need to have high rigidity, and this contributes to lightening of the device, temperature stability, and obtaining of a large space.

Furthermore, according to the embodiment of FIG. 10, the projection optical system PLA is suspended from the intermediate member 55 of the upper portion, so there is nothing that interferes with air flow from the center to the lower portion. Because of this, air conditioning of the device can be effectively performed by, for example, a downflow method. In addition, a large space is obtained, so the degree of freedom for designing various sensors or the like arranged in the measurement mounts 15 and 56 can be increased. Furthermore, in the case of replacing the projection optical system PLA, the projection optical system PLA can be easily taken in and out by a method in which the projection optical system PLA with the measurement mount 15 is removed from the rods 52A-52C (coupling members) and passes through an undepicted gate-type column. If this type of structure is used, the positioning relationships between the measurement system and the projection optical system PLA is adjusted in advance, and incorporation into the device is possible as-is. Thus, assembly process reduction and cost reduction can be improved.

Fifth Embodiment

Figure 12:
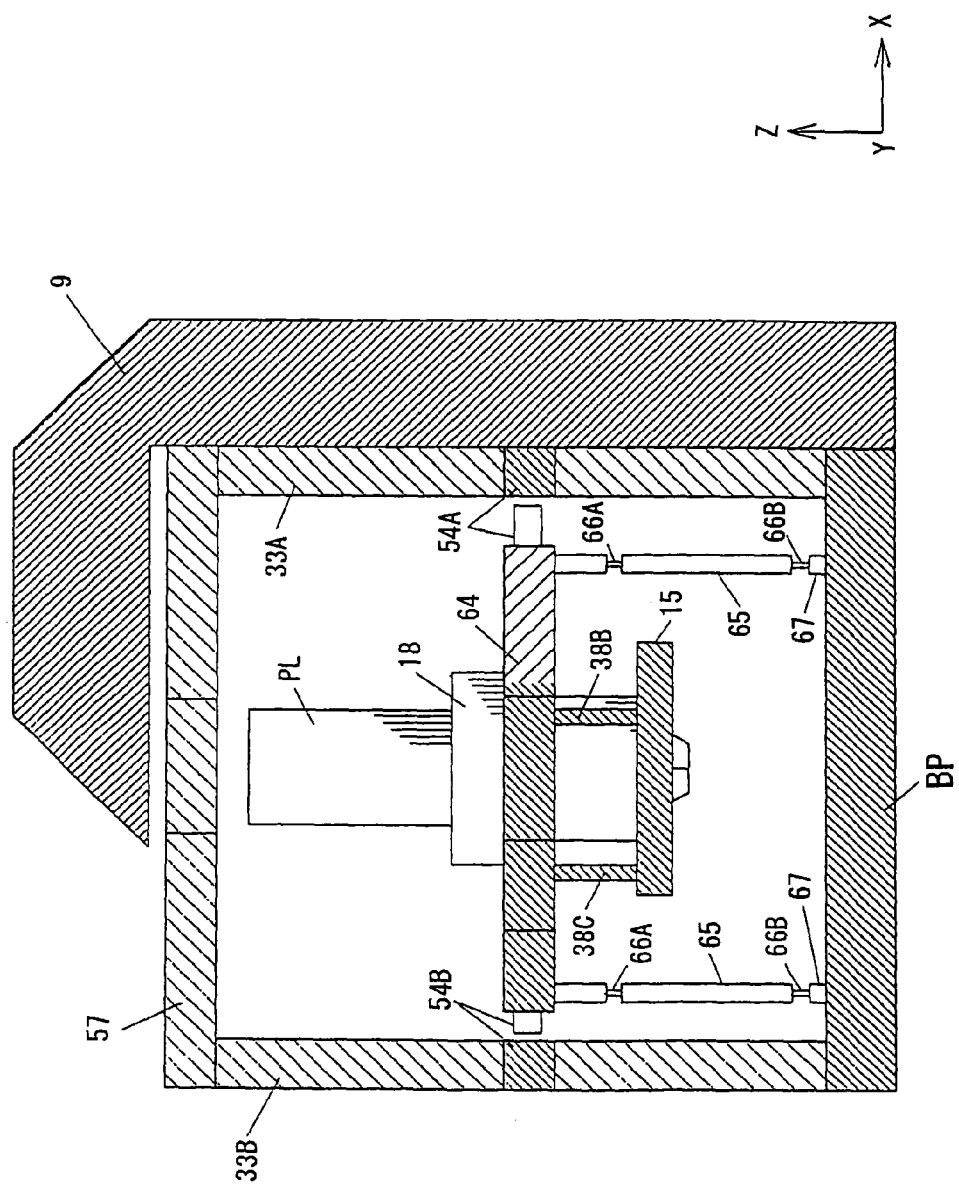
FIG. 12 is a schematic structural view that cuts through a portion of a projection exposure apparatus of a fifth embodiment.
Figure 13:
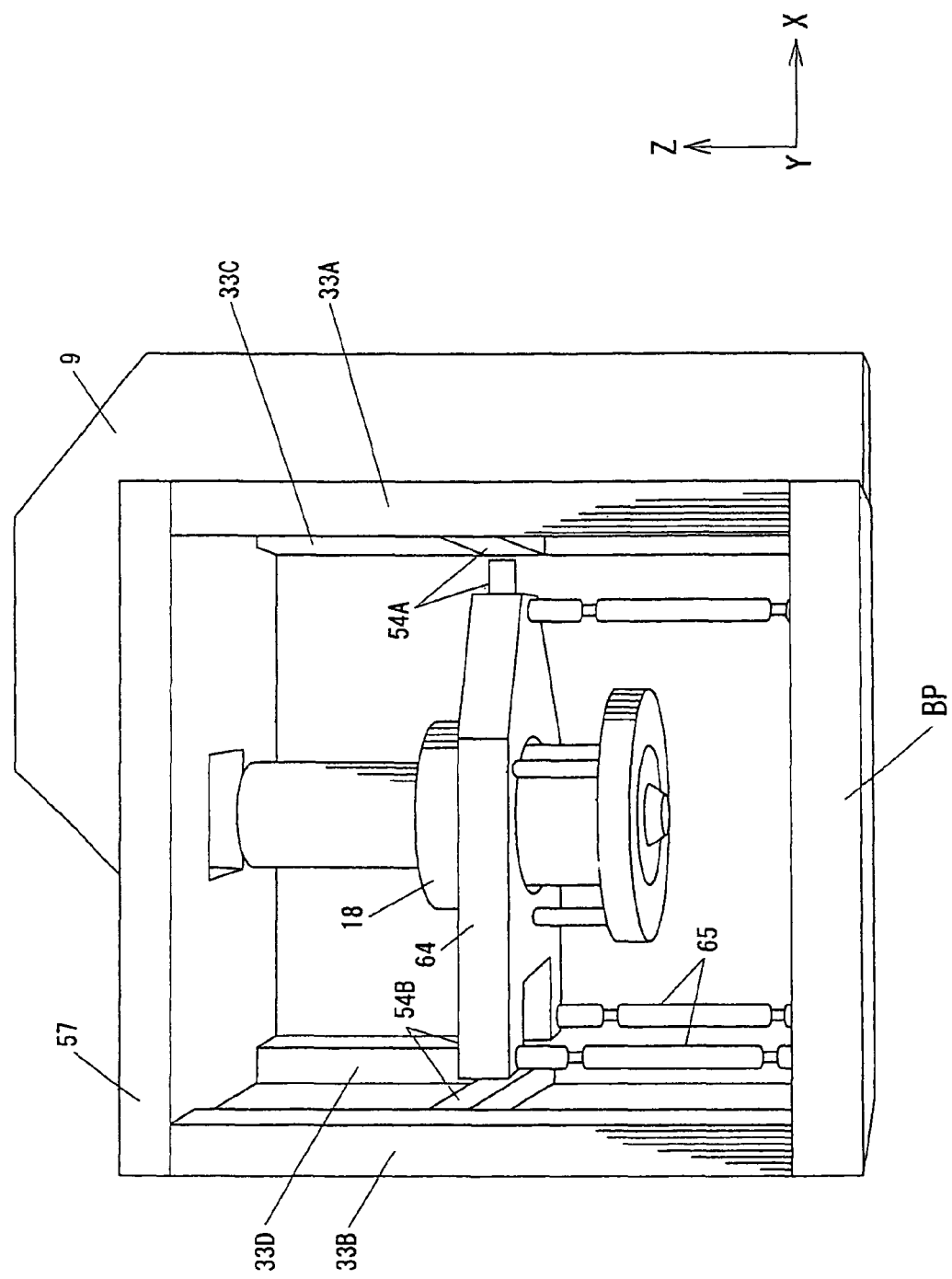
FIG. 13 is a perspective view of the FIG. 12 exposure apparatus.

The following explains a fifth embodiment of this invention with reference to FIGS. 12 and 13. In this example, that the projection optical system PL is supported from below by using a support mechanism that has rods. In FIGS. 12 and 13, the same symbols are used for the portions corresponding to FIGS. 1-11, so a detailed explanation of those portions is omitted here. A flange 18 of the projection optical system PL is mounted to a base molding 64 in which an opening is disposed. This base molding 64 is supported by the support mechanism from a base plate BP. The support mechanism flexibly supports the projection optical system PL in the Z direction via the base molding 64 and flexibly supports the projection optical system PL in the horizontal direction (XY direction) as well. In this embodiment, the support mechanism is provided with three rods 65 that are rigid in the Z direction and flexible in the horizontal direction (XY direction), flexures 66A, 66B formed at both end portions of the rods 65, and a coupling portion that connects the base molding 64 with the upper side of flexure 66A. Furthermore, in this embodiment, the rods 65 and the flexure 66A are integrally formed, but it is also acceptable to separate them using a leaf spring, etc. In addition, in this embodiment, the length of the rods 65 is 1 m or longer.

With respect to the flexures 66A, 66B, in the same manner as the flexures 38Aa, 38Ab shown in FIG. 5, displacement in five degrees-of-freedom other than expansion in the Z direction is possible. Because of this, hardly any applied force acts between the base molding 64 and the base plate BP. Thus, the base molding 64 is not easily deformed by vibration, etc. from the base plate BP.

Furthermore, the support mechanism of this embodiment is provided with a vibration isolation pad 67 arranged on the base plate BP, and that suppresses vibration in the Z direction transmitted from the base plate BP. For example, an air mount can be used as this vibration isolation pad 67.

Furthermore, in this embodiment, as shown in FIG. 13, the base molding 64 is supported by three support mechanisms.

In addition, in this embodiment, as shown in FIG. 13, the reticle base 57 is supported by four columns 33A-33D. Undepicted coils including a vertical coil and a horizontal coil that constitute a stator of the actuator 54A is arranged between the columns 33A and 33C. opposite to the base molding 64. In the same manner, undepicted coils including a vertical coil and a horizontal coil that constitute a stator of the actuator 54B is arranged between the columns 33B and 33D, opposite to the base molding 64. Permanent magnets that constitute movable elements of the actuators 54A, 54B are arranged in the base molding 64.

The actuators 54A, 54B are constituted by three actuators that displace the base molding 64 in the Z direction and three actuators that displace the base molding in the circumferential direction. The actuators 54A, 54B control the base molding 64 with six degrees-of-freedom.

If the projection optical system PL is supported by a parallel link mechanism, the projection optical system PL is rigidly supported in the Z direction and the horizontal direction (XY direction). In contrast, as described above, the support mechanism of this embodiment flexibly supports the projection optical system PL in the Z direction and the horizontal direction (XY direction), so the weight of the support mechanism can be made light, and the vibration of the projection optical system PL can be effectively cut off.

Furthermore, in this embodiment, the projection optical system PL is supported via the base molding 64, but the projection optical system PL can be directly supported. In this case, the support mechanism can, for example, directly support the projection optical system PL using the flange 18 of the projection optical system PL.

Furthermore, the projection optical system PL can be suspended from above using the support mechanism of this embodiment. In addition, in the above-described embodiment, the projection optical system PL was supported by using wires or rods, but the projection optical system can be supported by using a chain. The exposure apparatus of this embodiment can be applied to the above-mentioned stationary exposure type exposure apparatus, or to a scanning type exposure apparatus.

Furthermore, the projection exposure apparatus of the above-mentioned embodiment can be manufactured by incorporating and optically adjusting an illumination optical system composed of a plurality of lenses and a projection optical system into the main body of the exposure apparatus, and installing the reticle stage and the wafer stage composed of a plurality of mechanical parts to the main body of the exposure apparatus, connecting wires and pipes, and performing overall adjustment (electrical adjustment, operation check, etc.). Furthermore, it is preferable that manufacturing of the projection exposure apparatus is performed in a clean room with controlled temperature and cleanliness.

Furthermore, when a semiconductor device is manufactured by using the projection exposure apparatus of the above-described embodiments, the semiconductor device is manufactured by a step of designing a performance capability and function of the device, a step of manufacturing a reticle based on the designing step, a step of forming a wafer from a silicon material, a step of performing alignment by the exposure apparatus of the above-mentioned embodiment and exposing a pattern of the reticle onto a wafer, a step of forming a circuit pattern such as etching or the like, a step of assembling a device (including a dicing process, a bonding process, a packaging process), a step of testing, and the like.

This invention can be applied to a liquid crystal panel manufacturing exposure apparatus disclosed in, for example, International Publication No. WO 99/49504. Furthermore, this invention can be applied to a projection exposure apparatus using extreme ultraviolet light (EUV light) having a wavelength of several nm-100 nm as an exposure beam.

Furthermore, this invention is not limited to the application for the exposure apparatus for manufacturing a semiconductor device. For example, this invention can be applied to an exposure apparatus for manufacturing various devices such as a liquid crystal display element formed on a square-shaped glass plate, or a display device such as a plasma display or the like, or an imaging element (CCD), a micro-machine, a thin-film magnetic head, a DNA chip, or the like. Furthermore, this invention can be applied to an exposure process (exposure apparatus) in which a mask (photomask, reticle, or the like) having a mask pattern of various devices is formed by using a photolithographic process.

According to some aspects of this invention, when a projection optical system as a rigid structure is suspended and supported with respect to a predetermined member as a rigid structure via a coupling member as a flexible structure, there is a possibility of using the advantages of both rigid and flexible structures. Therefore, compared to a conventional example, a ratio occupied by a rigid structure can be reduced, so without reducing a device performance capability, a mechanism portion can be lightened, and the cost can be reduced.

The coupling members can extend through holes in the support member (flange 18) and attach to the lower surface of the flange 18, or can be attached inside of the flange 18, as opposed to being attached to the top surface of the flange 18, as illustrated in the drawings.

While the invention has been described with reference to preferred embodiments thereof, which are exemplary, it is to be understood that the invention is not limited to the preferred embodiments or constructions. The invention is intended to cover various modifications and arrangements. In addition, while the various elements of the preferred embodiments are shown in various combinations and configurations, that are exemplary, other combinations and configurations, including more, less or only a single element, are also within the spirit and scope of the invention.

What is claimed is:

1. A projection optical device, comprising:
   a frame member;
   a projection optical system which projects an image of a pattern;
   a support device having a flexible structure which has flexibility in a direction that crosses to a vertical direction and a vibration isolation device which is connected to the flexible structure and reduces a vibration, the support device supporting the projection optical system along the vertical direction relative to the frame member via the flexible structure and the vibration isolation device; and
   an actuator which generates a driving force that acts between the frame member and the projection optical system.

2. The projection optical device of claim 1, wherein the vibration isolation device reduces the vibration, in the vertical direction, that transmits to the projection optical system from the frame member.

3. The projection optical device of claim 2, wherein the flexible structure is formed to prevent vibration that transmits to the projection optical system via the frame member in the direction that crosses to the vertical direction.

4. The projection optical device of claim 3, wherein the flexible structure has a lower characteristic frequency in the direction that crosses to the vertical direction than in the vertical direction.

5. The projection optical device of claim 2, wherein the support device supports the projection optical system from an upper side of the projection optical system.

6. The projection optical device of claim 5, wherein the projection optical system hangs from the frame member.

7. The projection optical device of claim 2, wherein the support device supports the projection optical system from below the projection optical system.

8. The projection optical device of claim 2, wherein the actuator provides the driving force to the projection optical system in one of the vertical direction and the direction that crosses to the vertical direction.

9. The projection optical device of claim 8, wherein the actuator moves the projection optical system with respect to the frame member in a non-contact manner.

10. The projection optical device of claim 9, wherein the actuator moves the projection optical system along the vertical direction.

11. The projection optical device of claim 9, wherein the actuator moves the projection optical system along the direction that crosses to the vertical direction.

12. The projection optical device of claim 9, wherein the actuator moves the projection optical system along the vertical direction and the direction that crosses to the vertical direction.

13. The projection optical device of claim 8, wherein the actuator isolates vibration that transmits to the projection optical system from the frame member.

14. The projection optical device of claim 13, wherein the projection optical system and the frame member have a predetermined relationship to each other.

15. The projection optical device of claim 14, further comprising a displacement sensor which obtains displacement information of the projection optical system with respect to the frame member.

16. The projection optical device of claim 2, wherein the actuator isolates vibration that transmits to the projection optical system from the frame member.

17. The projection optical device of claim 1, wherein the actuator provides the driving force to the projection optical system in one of the vertical direction and the direction that crosses to the vertical direction.

18. The projection optical device of claim 17, wherein the actuator moves the projection optical system with respect to the frame in a non-contact manner.

19. The projection optical device of claim 18, wherein the actuator moves the projection optical system along the vertical direction.

20. The projection optical device of claim 18, wherein the actuator moves the projection optical system along the direction that crosses to the vertical direction.

21. The projection optical device of claim 18, wherein the actuator moves the projection optical system along the vertical direction and the direction that crosses to the vertical direction.

22. The projection optical device of claim 21, wherein the projection optical system and the frame member have a predetermined relationship to each other.

23. The projection optical device of claim 22, further comprising a displacement sensor which obtains displacement information of the projection optical system.

24. The projection optical device of claim 17, wherein the actuator isolates vibration that transmits to the projection optical system from the frame member.

25. The projection optical device of claim 1, wherein the actuator isolates vibration that transmits to the projection optical system from the frame member.

26. The projection optical device of claim 25, wherein the support device supports the projection optical system by an active suspension way by using the actuator.

27. An exposure apparatus provided with the projection optical device of claim 1 and a substrate holder, wherein an image of the pattern is transferred and exposed onto a substrate held by the substrate holder by the projection optical system.

28. A method for a lithography process, the method comprising:

exposing an object using the exposure apparatus according to claim 27; and
developing the exposed object.

29. The exposure apparatus of claim 27, wherein the substrate holder being supported movably relative to the projection optical system and being connected with the projection optical system through the vibration isolation device.

30. The exposure apparatus of claim 29, wherein the frame member is arranged on a floor and the substrate holder is arranged via a second vibration isolation device on the floor.

31. The projection optical device of claim 2, wherein the actuator including a first part and a second part cooperating with the first part for generating the driving force, the first part is arranged to the frame member and the second part is arranged to the frame member via the vibration isolation device.

32. A method of supporting a projection optical system which projects an image of a pattern in a projection optical device, the method comprising:

supporting the projection optical system relative to a frame member in a vertical direction by a support device, the support device having a flexible structure which has flexibility in a direction that crosses to the vertical direction and a vibration isolation device connected to the flexible structure, the support device supporting the projection optical system along the vertical direction via the flexible structure and the vibration isolation device; and acting a driving force generated by an actuator between the frame member and projection optical system.

33. The method of claim 32, wherein the vibration isolation device reduces the vibration, in the vertical direction, that transmits to the projection optical system from the frame member.

34. The method of claim 33, wherein the actuator provides the driving force to the projection optical system in one of the vertical direction and the direction that crosses to the vertical direction.

35. The method of claim 34, wherein the actuator isolates vibration that transmits to the projection optical system from the frame member.

36. The method of claim 32, wherein the actuator provides the driving force to the projection optical system in one of the vertical direction and the direction that crosses to the vertical direction.

37. The method of claim 36, wherein the actuator isolates vibration that transmits to the projection optical system from the frame member.

38. The method of claim 32, wherein the actuator isolates vibration that transmits to the projection optical system from the frame member.

39. The method of claim 32, wherein the actuator including a first part and a second part cooperating with the first part for generating the driving force, the first part is arranged to the frame member and the second part is arranged to the frame member via the vibration isolation device.

* * * * *